United States Patent
Gehl et al.

(10) Patent No.: US 11,906,351 B1
(45) Date of Patent: Feb. 20, 2024

(54) MONOLITHIC INTEGRATION OF OPTICAL WAVEGUIDES WITH METAL ROUTING LAYERS

(71) Applicant: National Technology & Engineering Solutions of Sandia, LLC, Albuquerque, NM (US)

(72) Inventors: Michael Gehl, Edgewood, NM (US); Christopher Todd DeRose, Albuquerque, NM (US); Hayden James McGuinness, Albuquerque, NM (US); Daniel Stick, Albuquerque, NM (US); Randolph R. Kay, Albuquerque, NM (US); Matthew G. Blain, Albuquerque, NM (US)

(73) Assignee: National Technology & Engineering Solutions of Sandia, LLC, Albuquerque, NM (US)

(*) Notice: Subject to any disclaimer, the term of this patent is extended or adjusted under 35 U.S.C. 154(b) by 85 days.

(21) Appl. No.: 17/846,855

(22) Filed: Jun. 22, 2022

Related U.S. Application Data

(63) Continuation-in-part of application No. 17/500,555, filed on Oct. 13, 2021, now Pat. No. 11,551,921.
(Continued)

(51) Int. Cl.
  *G01J 1/04* (2006.01)
  *G02B 6/124* (2006.01)
  *G02B 6/12* (2006.01)

(52) U.S. Cl.
  CPC ............ *G01J 1/0425* (2013.01); *G02B 6/124* (2013.01); *G02B 6/12004* (2013.01);
(Continued)

(58) Field of Classification Search
  CPC ... G01J 1/0425; G02B 6/12004; G02B 6/124; G02B 2006/12104; G02B 2006/12107; G02B 2006/12138
See application file for complete search history.

(56) References Cited

U.S. PATENT DOCUMENTS 5,410,622 A * 4/1995 Okada ................. H01L 31/0236
  257/E31.127
7,859,350 B1   12/2010 Schwindt et al.
(Continued)

FOREIGN PATENT DOCUMENTS

WO    WO2021006811 A1    1/2021

OTHER PUBLICATIONS

Aslan, M. M. et al., "Low-Loss Optical Waveguides for the Near Ultra-Violet and Visible Spectral Regions with Al2O3 Thin Films from Atomic Layer Deposition," Thin Solid Films, 2010, vol. 518, pp. 4935-4940.
(Continued)

*Primary Examiner* — Georgia Y Epps
*Assistant Examiner* — Don J Williams
(74) *Attorney, Agent, or Firm* — Mark A. Dodd

(57) ABSTRACT

A photonic integrated circuit and a method for its manufacture are provided. In an embodiment, an intermetal dielectric layer, for example, a silicon oxide layer, is contiguous between an upper metal layer and a lower metal layer on a substrate. One or more waveguides having top and bottom faces are formed in respective waveguide layers within the intermetal dielectric layer between the upper and lower metal layers. There is a distance of at least 600 nm from the upper metal layer to the top face of the uppermost of the several waveguides. There is a distance of at least 600 nm from the lower metal layer to the bottom face of the lowermost of the several waveguides. The waveguides are
(Continued)

formed of silicon nitride for longer wavelengths and alumina for shorter wavelengths. These dimensions and materials are favorable for CMOS processing, among other things.

17 Claims, 23 Drawing Sheets

Related U.S. Application Data which is a continuation-in-part of application No. 17/030,889, filed on Sep. 24, 2020, now Pat. No. 11,150,609.

(60) Provisional application No. 63/217,405, filed on Jul. 1, 2021, provisional application No. 62/905,835, filed on Sep. 25, 2019.

(52) U.S. Cl.
CPC .............. *G02B 2006/12104* (2013.01); *G02B 2006/12107* (2013.01); *G02B 2006/12138* (2013.01)

(56) References Cited

U.S. PATENT DOCUMENTS

| | | | | |
|---|---|---|---|---|
| 2012/0280345 | A1* | 11/2012 | Zhu | G02B 6/1226 257/E31.127 |
| 2015/0198775 | A1* | 7/2015 | Sandhu | H01L 31/02327 385/14 |
| 2015/0301363 | A1* | 10/2015 | Chen | H01L 29/4966 438/69 |

OTHER PUBLICATIONS

Borregaard, J. and Sorensen, A. S., "Efficient Atomic Clocks Operated with Several Atomic Ensembles," Physical Review Letters, 2013, vol. 111, pp. 090802-1-090802-5.
Derose, C. T. et al., "Ultra compact 45 GHz CMOS compatible Germanium waveguide photodiode with low dark current," Optics Express, 2011, vol. 19, pp. 24897-24904.
Derose, C. T. et al., "High Speed Traveling Wave Carrier Depletion Silicon Mach-Zehnder Modulator," Optical Interconnects Conference, Santa Fe, NM, 2012 2 pages.
Derose, C. T. et al., "Silicon Microring Modulator with Integrated Heater and Temperature Sensor for Thermal Control," OSA / CLEO/QELS, 2010, 2 pages.
Jau, Y-Y. et al., "Low-power, miniature 171Yb ion clock using an ultra-small vacuum package," Applied Physics Letters, 2012, vol. 101, pp. 253518-1-253518-4.
Jones, A. M. et al., "Ultra-low crosstalk, CMOS compatible waveguide crossings for densely integrated photonic interconnection networks," Optics Express, 2013, vol. 21, pp. 12002-12013.
Lentine, A. L. et al., "Silicon Photonics Platform for National Security Applications," 2015 IEEE Aerospace Conference, 2015, pp. 1-9, doi: 10.1109/AERO.2015.7119249.
Lentine, A. L. et al., "Active Wavelength Control of Silicon Microphotonic Resonant Modulators," Optical Interconnects Conference, 2012, IEEE.
Martinez, N. J. D. et al., "Single photon detection in a waveguide-coupled Ge-on-Si lateral avalanche photodiode," Optics Express, 2017, vol. 25, pp. 16130-16139.
Tamm, Chr. et al., "171Yb+ Single-Ion Optical Frequency Standard at 688 THz," IEEE Transactions on Instrumentation and Measurement, 2007, vol. 56, pp. 601-604.
Schioppo, M. et al., "Ultrastable optical clock with two cold-atom ensembles," Nature Photonics, 2016, vol. 11, pp. 48-53.
Schwindt, P. D. D. et al., "A highly miniaturized vacuum package for a trapped ion atomic clock," Review of Scientific Instruments, 2016, vol. 87, pp. 053112-1-053112-9.
Manginell, R. P. et al., "In situ dissolution or deposition of Ytterbium (Yb) metal in microhotplate wells for a miniaturized atomic clock," Optics Express, 2012, vol. 20, pp. 24650-24663.
Stenger, J. et al., "Absolute frequency measurement of the 435.5-nm 171Yb+-clock transition with a Kerr-lens mode-locked femtosecond laser," Optics Letters, 2001, vol. 26, pp. 1589-1591.
Weigel, P. O. et al., "Hybrid Silicon Photonic-Lithium Niobate Electro-Optic Mach-Zehnre Beyond 100 GHz," Arxiv, 2018, pp. 1-19.
Zortman, W. A. et al., "Low-voltage differentially-signaled modulators," Optics Express, 2011, vol. 19, pp. 26017-26026.
Brewer, S. M. et al., "A high-accuracy mobile Al+ optical clock," 2014, IEEE International Frequency Control Symposium (FCS), 1 page.
Dube, P. et al., "Evaluation of systematic shifts of the 88Sr+ single-ion optical frequency standard at the 10-17 level," Physical Review A, 2013, vol. 87, pp. 023806-1-023806-18.
Dube, P. et al., "Electric Quadrupole Shift Cancellation in Single-Ion Optical Frequency Standards," Physical Review Letters, 2005, vol. 95, pp. 033001-1-033001-4.
Itano, W. M. et al., "Quantum projection noise: Population fluctuations in two-level systems," Physical Review A, 1993, vol. 47, pp. 3554-3570.
Katzenmeyer, A. M. et al., "Volumetric Imaging and Characterization of Focusing Waveguide Grating Couplers," IEEE Photonics Journal, 2017, vol. 9, 10 pages.
Keller, J. et al., "Probing Time Dilation in Coulomb Crystals in a High-Precision Ion Trap," Physical Review Applied, 2019, vol. 11, pp. 011002-1-011002-7.
Kielpinski, D. C., et al., "Architecture for a large-scale ion-trap quantum computer," Nature, 2002, vol. 417, pp. 709-711.
Lalau-Keraly, C. M. et al., "Adjoint shape optimization applied to electromagnetic design," Optics Express, 2013, vol. 21, pp. 21693-21701.
Maunz, P., "High Optical Access Trap 2.0," SAND2016-0796R, Sandia National Laboratories (Jan. 26, 2016), 88 pages.
Mehta, K. K. and Ram, R. J., "Precise and diffraction-limited waveguide-to-free-space focusing gratings," Scientific Reports, 2017, vol. 7, 9 pages.
Moehring, D. L. et al., "Design, fabrication and experimental demonstration of junction surface ion traps," New Journal of Physics, 2011, vol. 13, 8 pages.
Niffenegger, R. J. et al., "Integrated optical control and enhanced coherence of ion qubits via multi-wavelength photonics," arXiv.org, arXiv:2001.05052 v1 (2020), 9 pages.
Payne, F. P. and Lacey, J. P. R., "A theoretical analysis of scattering loss from planar optical waveguides," Optical and Quantum Electronics, 1994, vol. 26, pp. 977-986.
Rosenband, T. and Leibrandt, D. R., "Exponential scaling of clock stability with atom number," 2013, arXiv:1303.6357v2, 5 pages.
Savchenkov, A. A. et al., "Stabilization of a Kerr frequency comb oscillator," Optics Letters, 2013, vol. 38, pp. 2636-2639.
Schneider, T. et al., "Sub-Hertz Optical Frequency Comparisons between Two Trapped 171Yb+ Ions," Physical Review Letters, 2005, vol. 94, pp. 230801-1-230801-4.
Schwindt, P. D. D. et al., "Miniature Trapped-Ion Frequency Standard with 171Yb +," 2015, Joint Conference of the IEEE International Frequency Control Symposium & the European Frequency and Time Forum, 6 pages.
Scherer, D. R. et al., "Progress on a Miniature Cold-Atom Frequency Standard," 2014, https://arxiv.org/abs/1411.5006, 10 pages.
Sebby-Strabley, J. et al., "Design Innovations Towards Miniaturized GPS-quality Clocks," 2016, IEEE International Frequency Control Symposium (IFCS), 6 pages.
Shappert, C. M. et al., "Spatially uniform single-qubit gate operations with near-field microwaves and composite pulse compensation," New Journal of Physics, 2013, vol. 15, 12 pages.
Warren, W. S. et al., "Multiple phase-coherent laser pulses in optical spectroscopy. I. The technique and experimental applications," The Journal of Chemical Physics, 1983, vol. 78, pp. 2279-2297.
Xuan, Y. et al., High-Q silicon nitride microresonators exhibiting low-power frequency comb initiation, Optica, 2016, vol. 3, pp. 1171-1180.

(56) References Cited

OTHER PUBLICATIONS

Aikyo, Y, et al., "Vacuum Characterization of a Compact Room-temperature Trapped Ion System," Applied Physics Letters, 2020, vol. 117, 234002, 5 pages.

Schwindt, P. D. D. et al., " A highly miniaturized vacuum package for a trapped ion atomic clock," Review of Scientific Instruments (2016), vol. 87 (Sandia Report No. SAND2015-10505J), pp. 053112-1-053112-9.

Setzer, W. J. et al., "Fluorescence Detection of a Trapped Ion with a Monolithically Integrated Single-Photon-Counting Avalanche Diode," arXiv preprint (2021), arXiv:2105.01235v2, 6 pages.

Lucas, D. M. et al., "Isotope-selective photoionization for calcium ion trapping," Physical Review A, 2004, vol. 69, pp. 012711-1-012711-13.

West, G. N. et al., "Low-loss integrated photonics for the blue and ultraviolet regime," APL Photonics, 2019, vol. 4, pp. 026101-1-026101-7.

Shu, G. et al., "Efficient fluorescence collection and ion imaging with the "tack" ion trap," Journal of the Optical Society of America B., 2011, vol. 28, pp. 2865-2870.

McLoughlin, J. J. et al., "Versatile ytterbium ion trap experiment for operation of scalable ion-trap chips with motional heating and transition-frequency measurements," Physical Review A, 2011, vol. 83, pp. 013406-1-013406-9.

\* cited by examiner

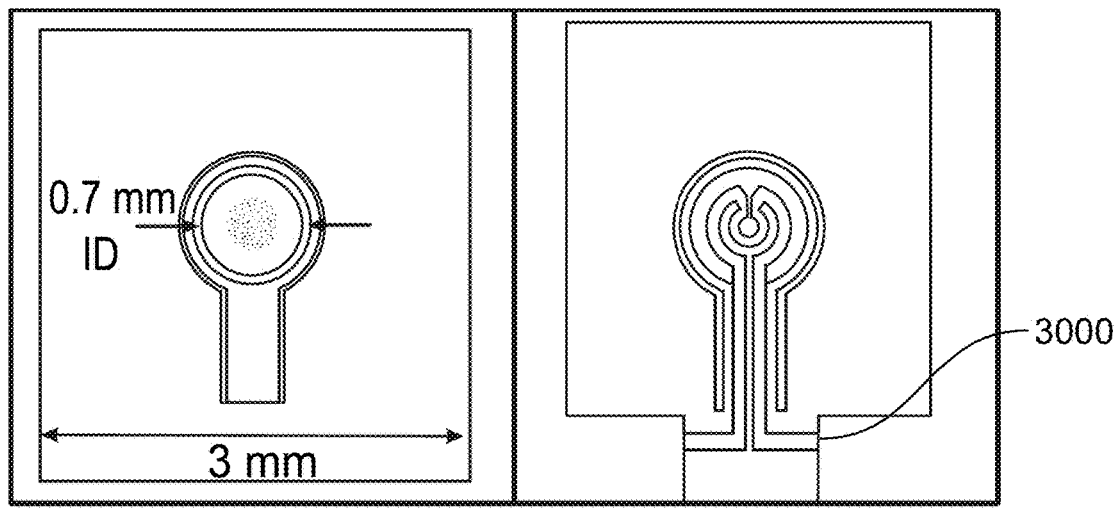
FIG. 30A   FIG. 30B
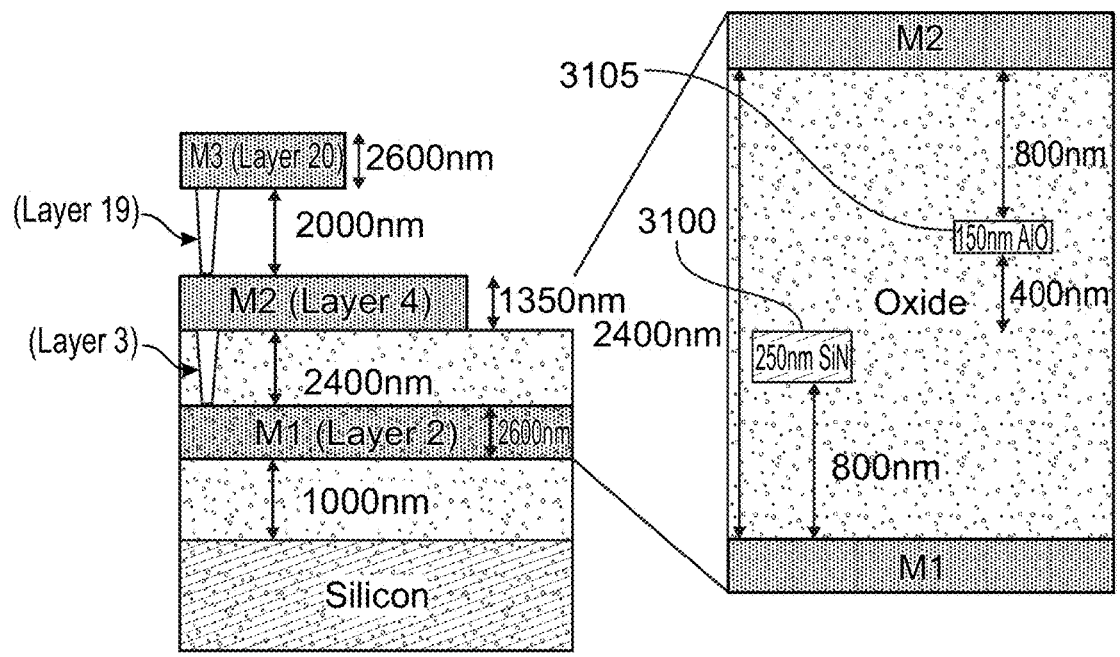
FIG. 31

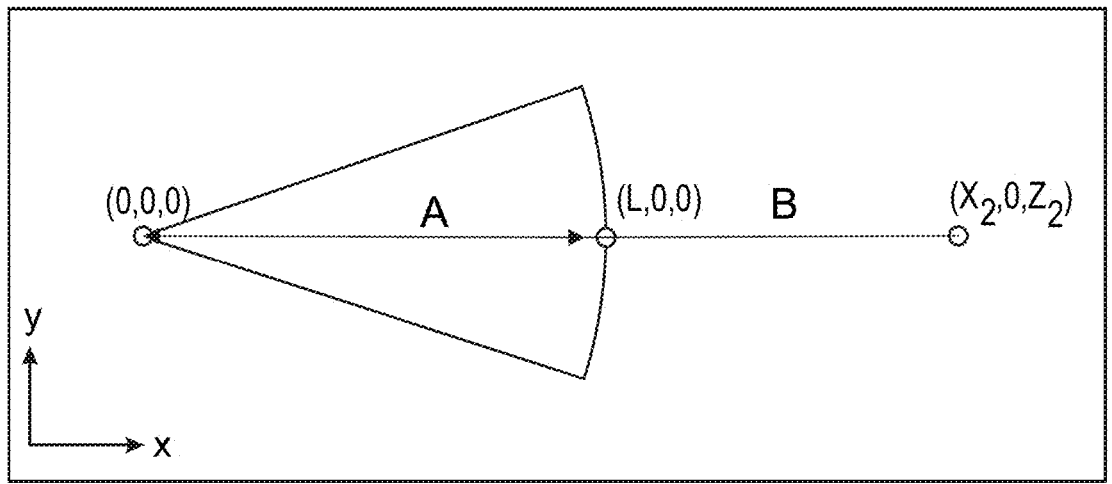
$A = n_{eff} \times L \qquad A + B = m\lambda$
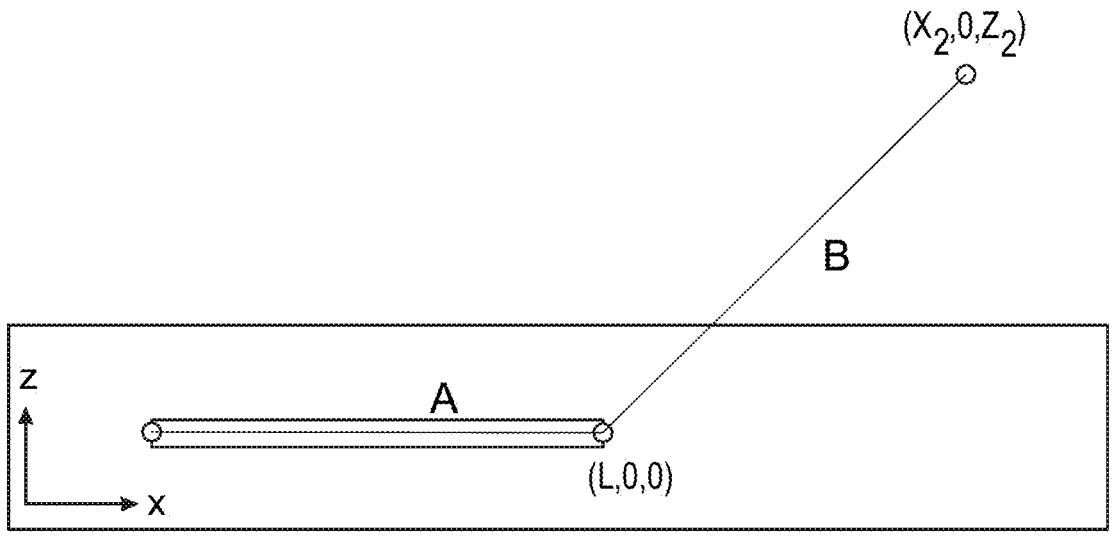
FIG. 43

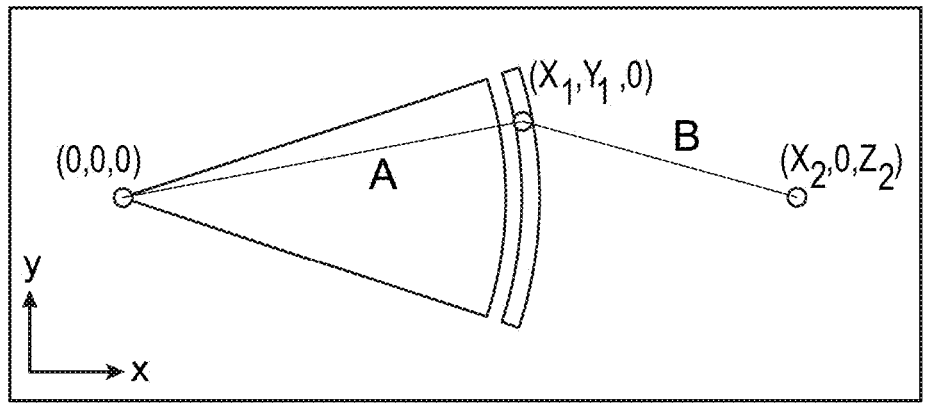
$$A = n_{eff} \times L + (DC \times n_{eff} + (1 - DC) \times n_{cladding}) \times \left(\sqrt{X_1^2 + Y_1^2} - L\right) \quad A + B = (m + 1)\lambda$$
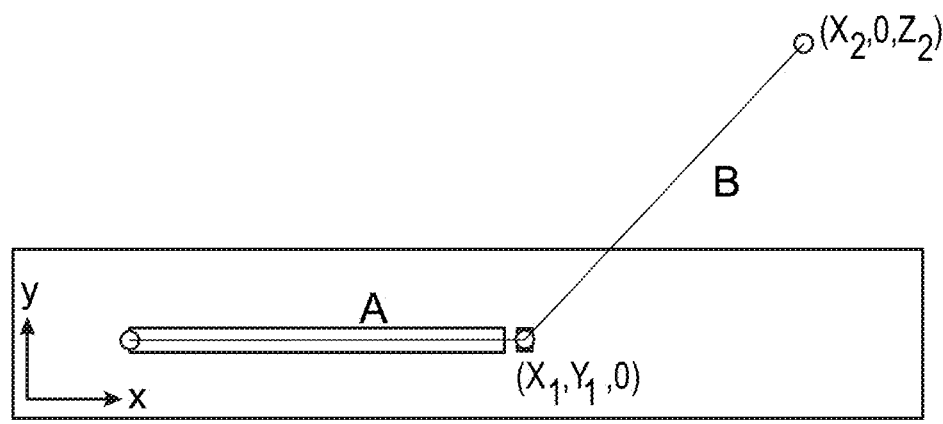
FIG. 44

MONOLITHIC INTEGRATION OF OPTICAL WAVEGUIDES WITH METAL ROUTING LAYERS

RELATED APPLICATIONS

This application is a continuation-in-part of, and claims priority to, U.S. application Ser. No. 17/500,555, filed Oct. 13, 2021, and entitled MINIATURIZED VACUUM PACKAGE AND METHODS OF MAKING SAME, which is a continuation-in-part of, and claims priority to, U.S. application Ser. No. 17/030,889, filed on Sep. 24, 2020, and entitled TRAPPED ION PLATFORM WITH OPTICAL INPUT AND OUTPUT, now U.S. Pat. No. 11,150,609, which claims priority to U.S. Provisional Application No. 62/905,835, filed on Sep. 25, 2019, and entitled TRAPPED ION PLATFORM WITH OPTICAL INPUT AND OUTPUT, the entirety of each of which is incorporated herein by reference. This application further claims priority to U.S. Provisional Application No. 63/217,405, filed on Jul. 1, 2021, and entitled MONOLITHIC INTEGRATION OF OPTICAL WAVEGUIDES WITH METAL ROUTING LAYERS, the entirety of which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The invention relates to photonic integrated circuits and methods for fabricating them.

BACKGROUND

In recent years, there has been increasing interest in the development of atomic clocks in which the frequency reference is provided by an optical transition of an atom or ion. Several different methods have been attempted for isolating and maintaining the host atomic systems. These include ion traps, optical lattices, and magneto-optical traps. Microfabricated surface ion traps are of especial interest in this regard because they are highly manufacturable, their performance is repeatable due to the lithographic electrode definitions, and they can trap and manipulate many single ions within a trap array.

In a surface ion trap, individual ions are confined by superposed electrostatic and radio frequency (RF) fields. The technology of ion traps was first developed for applications in mass spectrometry. The development of this technology has accelerated recently, because of the realization that an ensemble of trapped atomic ions is a promising host system for the operations that underlie quantum computation.

Surface ion traps offer new opportunities to design atomic clocks that are both accurate and portable.

Photonic integrated circuits (PICs) are gaining in importance for applications such as optical fiber communication and photonic computing. The technology of PICs is supported by several different platforms, one of which is the silicon photonics (SiP) platform.

The SiP platform has a proven ability to support complex multichannel PICs. These integrated circuits typically include devices such as modulators and photodiodes. SiP circuits have the important advantage that they are manufacturable by CMOS processes, so that the infrastructure that has already been developed to build CMOS electronics can be used for their production as well. For the same reason, SiP circuits can be monolithically integrated with CMOS electronics, which is an additional advantage.

Metal components are essential in many integrated photonics systems. Metal layers provide electrical connectivity, as well as grounding and electrical shielding. Metal vias provide electrical connectivity between layers of the photonic wafer. However, the use of metal also has drawbacks. For example, metal interacting with the optical mode of a waveguide can cause excess loss. In another example, the presence of a metal layer can increase the surface roughness in a waveguide layer fabricated over it. Consequently, the incorporation of metal features can pose severe challenges in the design of integrated photonic circuitry.

These challenges are especially severe in designs that call for optical routing in a lateral plane between metallization layers. Undesirably large thicknesses of intermetal dielectric may be needed, in order to avoid prohibitive interactions between the metal layers and the waveguides. This problem may be aggravated further if multiple optical routing layers are needed between the layers of metal.

Further, the geometry of vertical metal vias dictates that as the vertical height of the via increases, the lateral extent of the via must increase as well. This, in turn, may have the undesirable consequence of limiting the real estate available for circuitry on the surface of the wafer.

There is, then, a need for new approaches that permit greater proximity between waveguides and metal features.

SUMMARY

One aspect of the present invention relates to a process that enables two or more independent waveguide layers to be routed between closely spaced metal layers. Adaptations of the process also enable metal layers and vias to be used as optical shields for reducing waveguide cross-talk and stray light. In specific applications, such optical shielding can improve the performance of devices such as ion traps and single photon detectors.

In at least one embodiment of the present invention, a photonic integrated circuit comprises a lower metal layer, an intermetal dielectric level on the lower metal layer, an upper metal layer on the intermetal dielectric level, and one or more waveguide levels within the intermetal dielectric level (each waveguide level including one or more waveguides formed therein, each of the one or more waveguide levels having corresponding top and bottom faces), a top face of an uppermost waveguide level of the one or more waveguide levels being a distance D1 from the upper metal layer, a bottom face of a lowermost waveguide level of the one or more waveguide levels being a distance D2 from the lower metal layer, and D1 and D2 are both at least 600 nm but not more than 1200 nm.

In other photonic integrated circuits, the intermetal dielectric level includes silicon oxide; at least one of the one or more waveguide levels includes silicon nitride having a thickness of 250 nm±20%; at least one of the one or more waveguide levels includes alumina having a thickness of 150 nm±20%; D1 and D2 are both 800 nm±20%; and the one or more waveguide levels is only one waveguide level.

In yet other photonic integrated circuits, the one or more waveguide levels is two waveguide levels, at least one of the two waveguide levels is a lower waveguide level, at least another of the two waveguide levels is an upper waveguide level, the lower waveguide level is closer to the lower metal layer than the upper metal layer, the upper waveguide level is closer to the upper metal layer than the lower metal layer, and the lower waveguide level is a distance D3 from the upper waveguide level; and the lower waveguide level includes silicon nitride having a thickness of 250 nm±20%, the upper waveguide level includes alumina having a thickness of 150 nm±20%, D3 is 400 nm±50 nm, and the intermetal dielectric level has a total thickness of 2.4 μm±20%.

In still other photonic integrated circuits, the photonic integrated circuit further comprises one or more metal vias in the intermetal dielectric level (each of the one or more waveguides formed in each of the one or more waveguide levels laterally separated from each of the one or more metal vias by a distance D4); D4 is at least 600 nm; the photonic integrated circuit further comprises one or more gratings (each of the one or more gratings formed in a corresponding one of the one or more waveguide levels, each of the one or more gratings for out-coupling light), the one or more metal vias includes one or more encircling baffles (each of the one or more encircling baffles at least partially encircling a corresponding one of the one or more gratings, each of the one or more encircling baffles for blocking stray light); and the photonic integrated circuit further comprises one or more reflectors (each of the one or more reflectors formed in the lower metal layer below a corresponding one of the one or more gratings, each of the one or more reflectors for reflecting light).

In other photonic circuits, the photonic integrated circuit further comprises a second intermetal dielectric level on the upper metal layer on a side opposite the intermetal dielectric layer, a third metal layer on the second intermetal dielectric level on a side opposite the upper metal layer, and one or more second level metal vias in the second intermetal dielectric level, the one or more second level metal vias includes one or more second level encircling baffles (each of the one or more second level encircling baffles at least partially encircling a corresponding one of the one or more gratings, each of the one or more second level encircling baffles for blocking stray light).

In yet other photonic integrated circuits, the one or more metal vias includes one or more linear baffles (each of the one or more linear baffles adjacent to a corresponding one of the one or more waveguides formed in each of the one or more waveguide levels, each of the one or more linear baffles for blocking stray light); and at least one of the one or more waveguides formed in each of the one or more waveguide levels is surrounded by the lower metal layer, the upper metal layer, and two of the one or more linear baffles.

In still other photonic integrated circuits, the photonic integrated circuit further comprises one or more gratings (each of the one or more gratings formed in a corresponding one of the one or more waveguide levels, each of the one or more gratings for out-coupling light); and the photonic integrated circuit further comprises one or more reflectors (each of the one or more reflectors formed in the lower metal layer below a corresponding one of the one or more gratings, each of the one or more reflectors for reflecting light).

In other photonic circuits, the photonic integrated circuit further comprises a second intermetal dielectric level on the upper metal layer on a side opposite the intermetal dielectric layer, a third metal layer on the second intermetal dielectric level on a side opposite the upper metal layer, and one or more second waveguide levels within the second intermetal dielectric level (each second waveguide level including one or more second level waveguides formed therein, each of the one or more second waveguide levels having corresponding top and bottom faces), a top face of an uppermost second waveguide level of the one or more second waveguide levels is a distance D5 from the third metal layer, a bottom face of a lowermost second waveguide level of the one or more second waveguide levels is a distance D6 from the upper metal layer, and D5 and D6 are both at least 600 nm but not more than 1200 nm.

In at least one embodiment of the present invention, an optical detector comprises a substrate doped with a first dopant type (the substrate being a cathode), one or more anodes formed in a surface of the substrate (the one or more anodes doped with a second dopant type), one or more deep guard ring implants formed in the surface of the substrate (the one or more deep guard ring implants doped with the second dopant type, each of the one or more deep guard ring implants formed around a corresponding one of the one or more anodes), a substrate contact formed in the surface of the substrate around the one or more anodes (the substrate contact doped with the first dopant type), a first oxide layer formed on the surface of the substrate (a first aperture formed in the first oxide layer exposing at least the one or more anodes), one or more first vias formed through the first oxide layer (each of the one or more first vias in electrical contact with a corresponding one of the one or more anodes), a second via formed through the first oxide layer (the second via in electrical contact with the substrate contact), a first metal layer formed on the first oxide layer (the one or more first vias and the second via in electrical contact with the first metal layer, a second aperture formed in the first metal layer directly over the first aperture), a second oxide layer formed on the first metal layer (a third aperture formed in the second oxide layer directly over the second), and a second metal layer formed on the second oxide layer (the second metal layer including a mesh suspended over the third aperture, the mesh allowing light to fall on the one or more anodes, the mesh providing electric field shielding); and the mesh includes one of a hub and spoke configuration or a rectilinear mesh configuration.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

In FIG. 3, values are plotted for wavelengths of 369 nm, 399 nm, 435 nm, 760 nm, and 935 nm in an alumina waveguide of an exemplary design. In FIG. 4, values are plotted for the same wavelengths in a silicon nitride waveguide of an exemplary design.

FIG. 16 is similar to FIG. 13, but some details are complementary between the two figures.

In FIG. 25, the intermediate wafer is shown coupled to an ion-trap platform.

FIG. 30A is a view of the backside of an example micro-hotplate according to an example embodiment. Visible in FIG. 30A is a cup structure with an inside diameter of 0.7 mm.

FIG. 30B is a view of the micro-hotplate of the preceding figure, showing the silicon micro-hotplate cup structure with a low-resistance Pt/ZnO heating wire.

FIG. 31 is a cross-sectional schematic drawing of an example prototype of an ion-trap platform according to the principles discussed here.

FIGS. 43 and 44 illustrate selected steps in a design procedure for diffractive grating couplers useful in the practice of the ideas presented here.

DETAILED DESCRIPTION

Described here is a highly integrated photonic-atomic ion clock using multiple ytterbium ions confined on a surface ion trap. Optical ion clocks have demonstrated exceptional stability and accuracy. As a host atom, the $^{171}$Yb$^+$ ion is a promising candidate for a transportable clock that requires balancing the ultimate performance with size, weight, and power (SWAP) considerations.

Ion-trapping technologies suitable for trapping $^{171}$Yb$^+$ ions, among others, are known. One such technology, which can be adapted for the purposes described here, is the technology of linear surface radio-frequency (RF) traps, such as the HOA-2 trap designed by Sandia National Laboratories. A description of the HOA-2 technology can be found, for example, in P. Maunz, "High Optical Access Trap 2.0," SAND2016-0796R, Sandia National Laboratories (2016), the entirety of which is hereby incorporated herein. Other technologies may also be similarly adapted.

Figure 1:
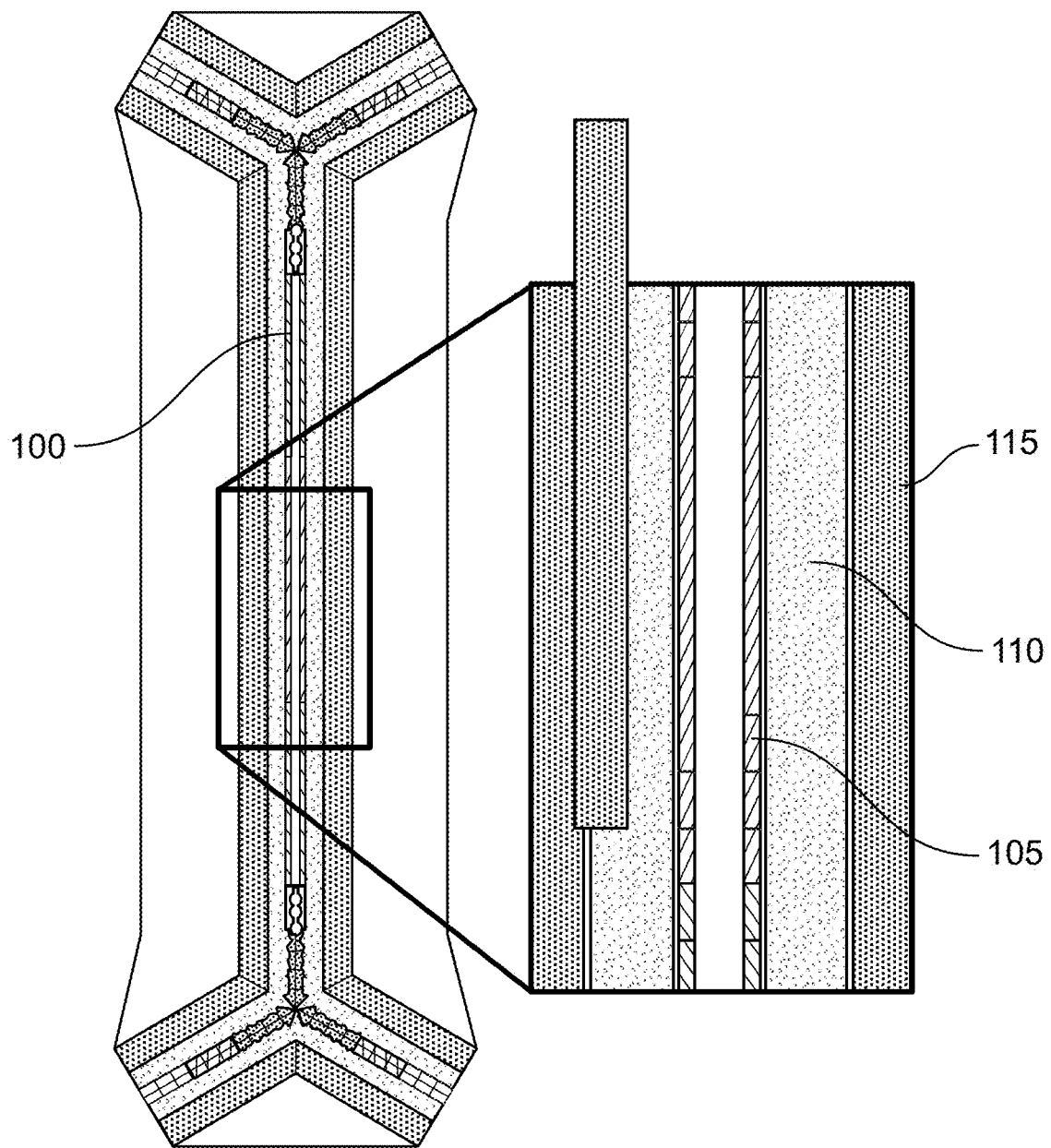
FIG. 1 is a simplified schematic drawing, in plan view, of a typical linear surface RF trap of the prior art.

FIG. 1 is a simplified schematic drawing, in plan view, of a typical linear surface RF trap. As best seen in the inset to FIG. 1, the central axis 100 where ion trapping takes place is bounded on each side by dc control electrodes 105, RF electrodes 110, and dc compensation electrodes 115. The ions are loaded into the trapping sites from loading holes, which are not shown in FIG. 1. The loading hole positions are offset from the trapping site positions.

In addition to the trapping electrodes, our new trap chip includes waveguides for light delivery and input couplers for interfacing with fibers that deliver laser light from off-chip sources. The trap chip could also include modulators for controlling light intensity.

In our current design, the photodetectors are monolithically integrated below the trap to read out the states of individual ions. In alternative designs, the detectors may be added by hybrid integration.

Figure 2:
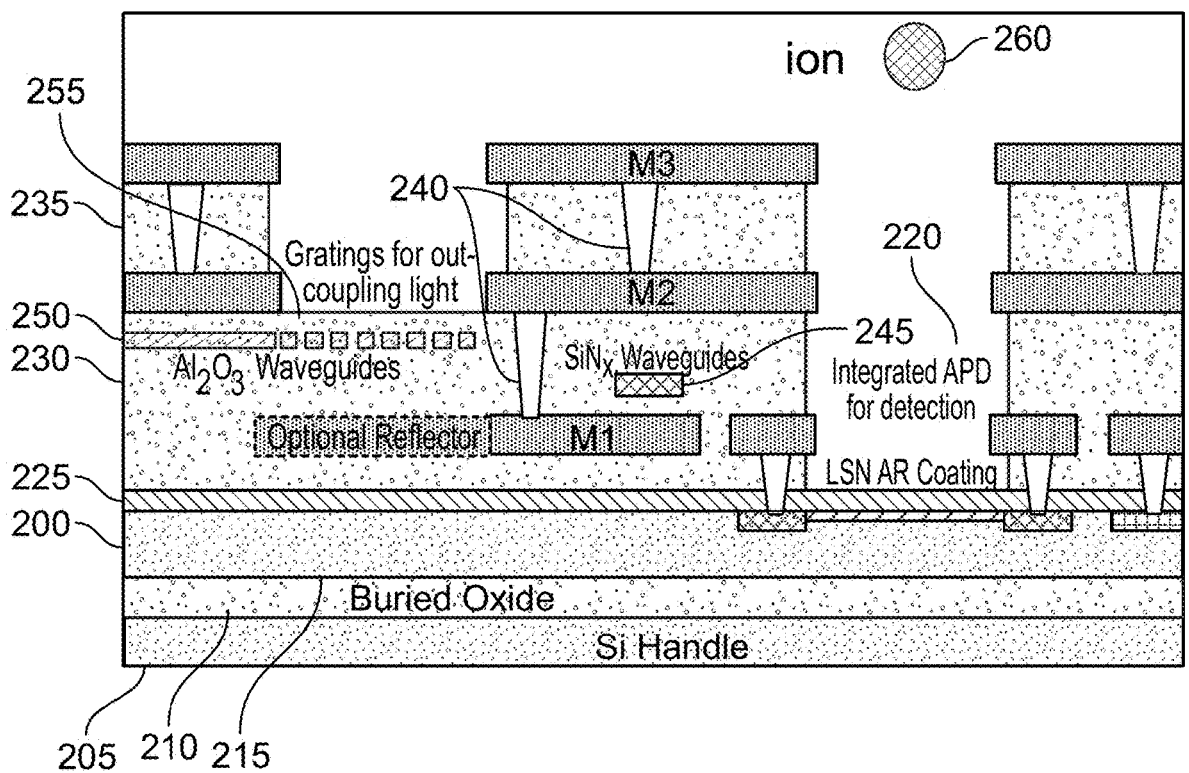
FIG. 2 is a schematic cross-sectional view of a new trap design according to the principles discussed herein, in an example embodiment.

FIG. 2 is a schematic cross-sectional view of our new trap design in an example embodiment. As seen in FIG. 2, an SOI substrate 200 includes a silicon handle layer 205, a buried oxide layer 210, and a silicon device layer 215 in which a monolithically integrated photodetector 220 is shown. An optional antireflection layer 225 of low-stress silicon nitride overlies the photodetector. Three layers of metallization, respectively labeled M1, M2, and M3 are shown, with levels 230, 235 of intermetal dielectric of silicon oxide between them. The metal layers are interconnected by metal vias 240.

Waveguides are embedded at two levels within the intermetal dielectric between M1 and M2. Silicon nitride waveguides 245 are at one level, and alumina waveguides 250 are at the other level. In other embodiments, the silicon nitride waveguides are in the upper level while the alumina waveguides are in the lower level. In still other embodiments, more than two levels of silicon nitride and alumina waveguides may be included. As shown in FIG. 2 for the alumina waveguide, gratings 255 formed at the output ends of the waveguides out-couple light into beams directed at the trapping site where trapped ion 260 is shown. While not shown in FIG. 2, similar gratings may be formed on the ends of silicon nitride waveguides 245.

With further reference to the drawing, it will be seen that the trapped ion is confined at a height above the top metal M3, and that there is a direct, vertical line of sight from the trapped ion to the photodetector.

As noted above, the device described here utilizes a multiplicity of trapped ions of the host atom. Utilizing many ions in the operation of the atomic clock offers several advantages, including an increase by a factor of N in the signal-to-noise ratio (SNR), where N is the number of trapped ions that are interrogated.

The many-ion approach can also enable separate and staggered interrogation. This is advantageous because it can eliminate dead time, which is a significant error source in atomic clocks. The many-ion approach can also make it possible to designate selected ions for monitoring and correcting for systematic shifts, such as those caused by magnetic fields.

Another important benefit of our approach is that different ensembles of ions can be interrogated on different timescales. Thus, for example, both a short-timescale feedback loop and a long-timescale feedback loop can be used to stabilize the local oscillator, leading to improvements in overall stability. A typical short timescale could, for example, be on the order of 100 µs, whereas a typical long timescale could be on the order of 1 ms. In effect, two or more clocks are operated on a common platform. The concurrent operation of two atomic clocks of conventional design for purposes of stabilization is possible in principle, but there are practical obstacles because of the prohibitive size of conventional atomic clocks. Our design overcomes these obstacles.

Figure 3:
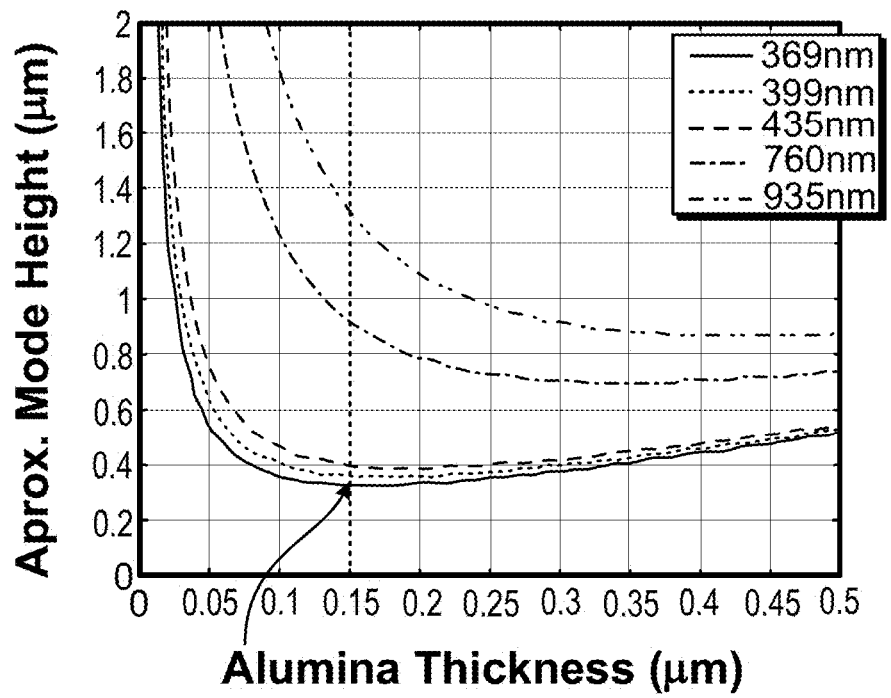
FIGS. 3 and 4 are theoretical graphs showing how the optical confinement of a guided wave depends on the thickness of the waveguide. In the graphs, the approximate mode height, in micrometers, is plotted as a function of the waveguide thickness.
Figure 4:
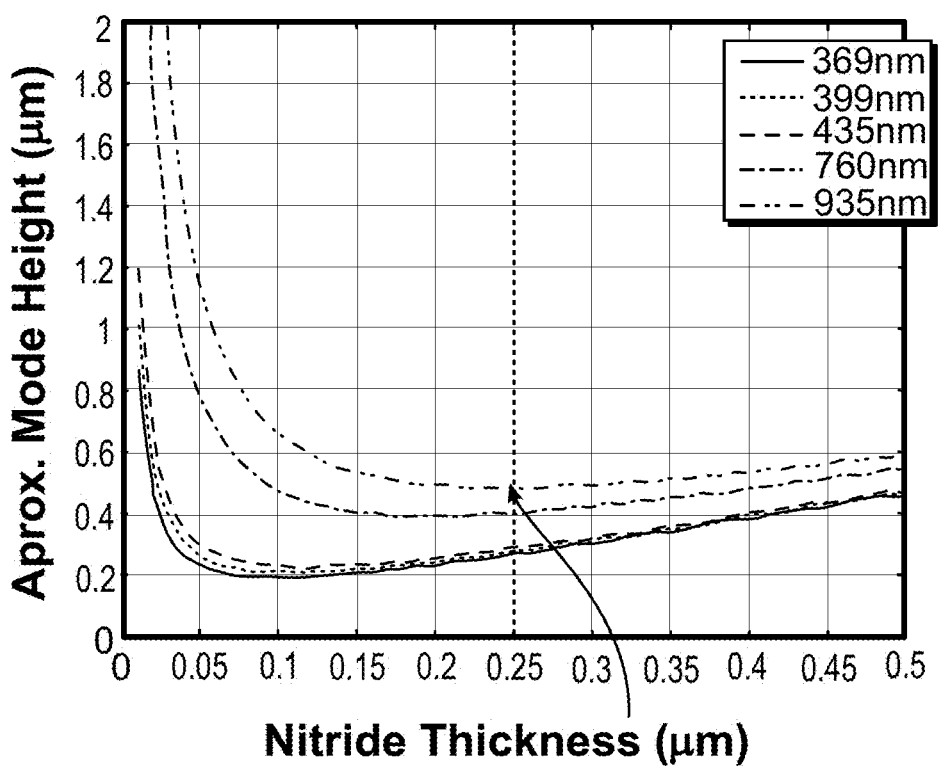

FIGS. 3 and 4 are theoretical graphs, generated by numerical simulation, showing how the optical confinement of a guided wave depends on the thickness of the waveguide. In the graphs, the approximate mode height, in micrometers, is plotted as a function of the thicknesses of the waveguides 250 and 245, respectively. In FIG. 3, values are plotted for wavelengths of 369 nm, 399 nm, 435 nm, 760 nm, and 935 nm in an alumina waveguide 250 of an exemplary design. In FIG. 4, values are plotted for the same wavelengths in a silicon nitride waveguide 245 of an exemplary design. The simulations assume a slab waveguide. The refractive indices used in the simulation for alumina and silicon nitride were taken from measurements of optimized films. As modeled, the film is surrounded on top and bottom by silicon oxide.

As FIGS. 3 and 4 show, the vertical extent of the optical mode reaches a minimum at a particular thickness of the dielectric material of the waveguides 250, 245. For UV-visible wavelengths, the alumina waveguide 250 is seen to provide the greatest confinement at a thickness of 150 nm, with a modal FWHM of about 300-400 nm. For near infrared (NIR) wavelengths, the silicon nitride waveguide 245, which has a higher refractive index, provides better confinement than alumina. The silicon nitride waveguide 245 is seen to provide the greatest confinement at a thickness of about 250 nm, giving a modal FWHM of about 400-500 nm.

Figure 5:
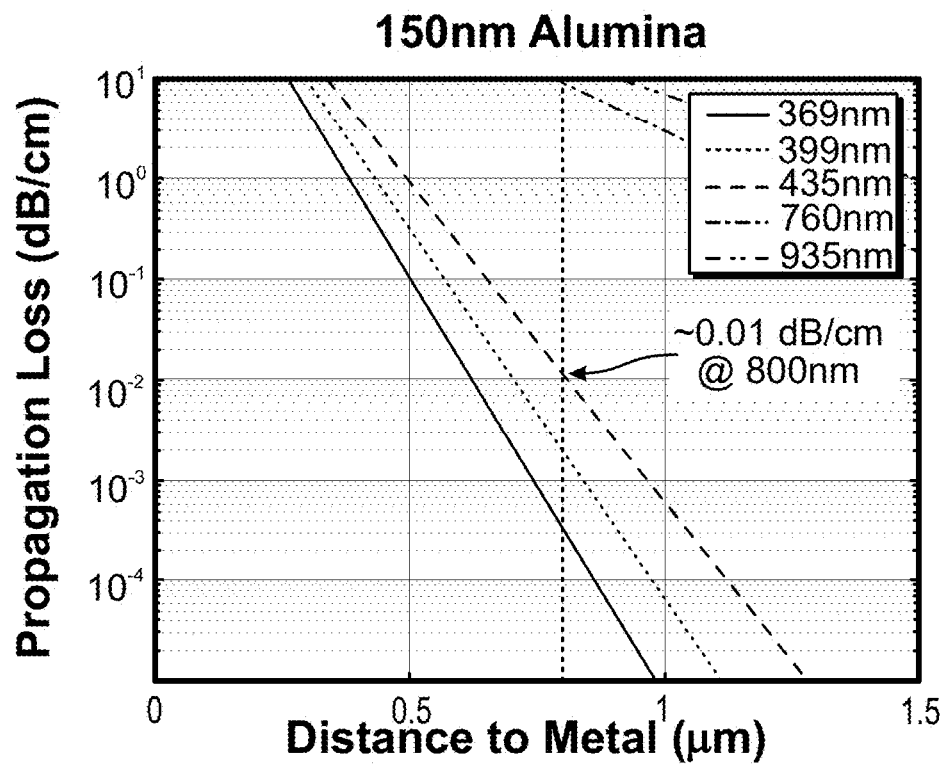
FIGS. 5 and 6 are theoretical graphs of propagation loss in the waveguides of FIGS. 3 and 4, in decibels per centimeter, as a function of vertical separation from a layer of metal. The wavelengths are the same as in the preceding figures. The waveguide thicknesses are 150 nm for alumina and 250 nm for silicon nitride.
Figure 6:
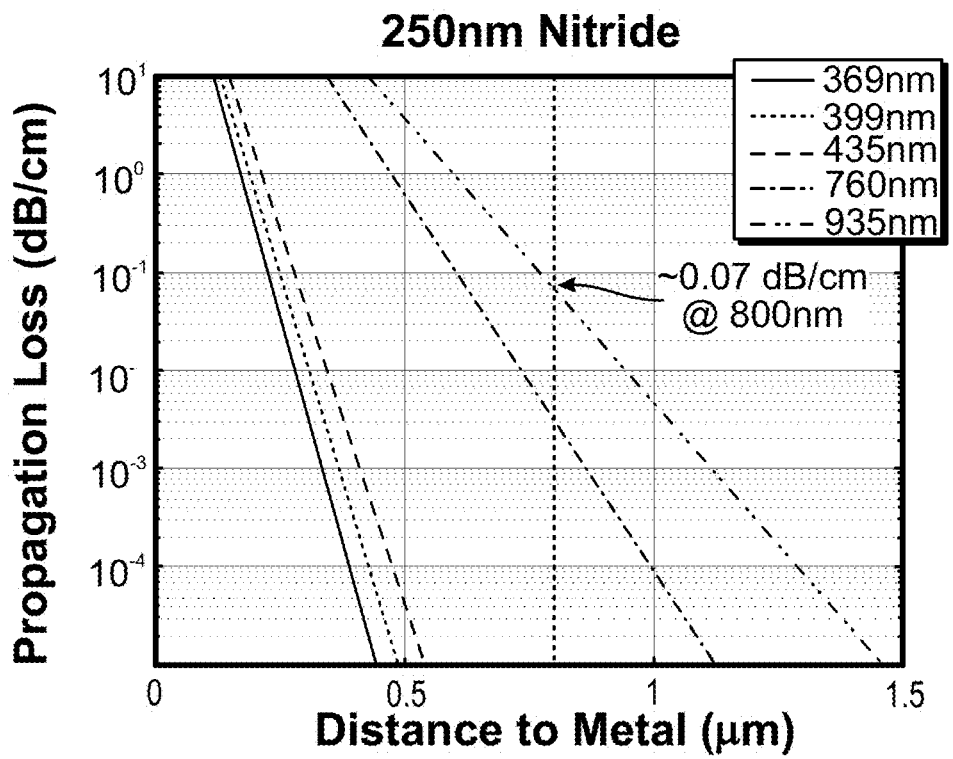

FIGS. 5 and 6 are theoretical graphs of propagation loss in the waveguides 250, 245 of FIGS. 3 and 4, in decibels per centimeter, as a function of vertical separation from a layer of metal, for example, M1 or M2. The wavelengths are the same as in FIGS. 3 and 4. The thicknesses are 150 nm for the alumina waveguide 250 and 250 nm for the silicon nitride waveguide 245. These thicknesses were chosen because they are near the values where modal confinement is greatest.

As FIG. 5 indicates, the propagation loss in the alumina waveguide 250 at a vertical separation of 800 nm is about 0.01 dB/cm at 435 nm, and less at 399 nm and 369 nm. As FIG. 6 indicates, at the same vertical separation, the propagation loss in the silicon nitride waveguide 245 is about 0.07 dB/cm at 935 nm, and less at 760 nm.

The plots of FIGS. 5 and 6 account only for propagation losses due to the metal layer, for example, M1 or M2. In practice, however, the waveguides 250, 245 will also have loss due to material absorption and due to scattering caused by surface roughness. For the alumina waveguide 250 in the range of wavelengths from 369 nm to 435 nm, we have measured about 1 dB/cm for these absorptive and scattering losses. For the silicon nitride waveguide 245 in the range of wavelengths from 760 nm to 935 nm, we have measured about 0.3 dB/cm for the same type of losses.

For both the alumina and silicon nitride waveguides 250, 245, the loss due to absorption in the metal, for example M1 or M2, at a vertical separation of 800 nm is significantly less than the losses associated with the waveguide 250, 245 alone. These levels of loss indicate that a vertical separation of 800 nm would be adequate for at least some integrated photonic systems. Similar separations would be indicated, in the horizontal direction, between the waveguides 250, 245 and vertical metal vias 240.

More broadly, a range of vertical separations between the waveguides 250, 245 and the metal layers, for example, M1 or M2, of between 600 nm to 1200 nm is of interest in this context. Separations of 1200 nm or less are of particular interest because they can be compatible with standard CMOS processes. In more specific contexts, a vertical separation of 800 nm±20% is of interest. For horizontal separations between the waveguides 250, 245 and metal, for example vias 240, similar separations would be of interest.

Figure 7:
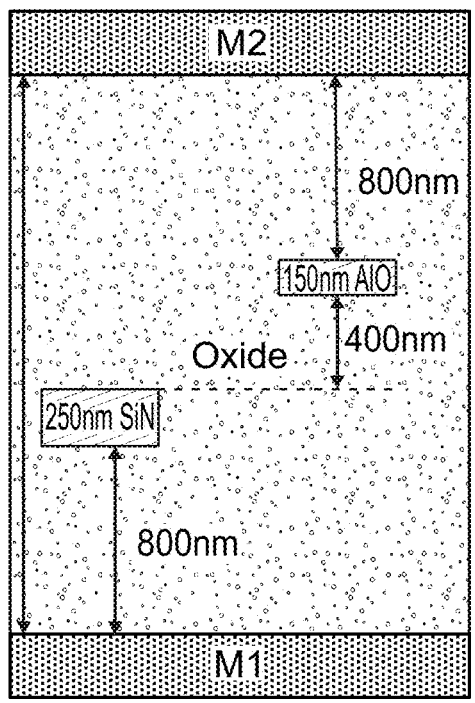
FIG. 7 is a drawing showing, in cross section, a design for a layer structure based on the findings reported above.

FIG. 7 is a drawing showing, in cross section, a design for a layer structure based on the findings reported above. As shown, the M1 and M2 layers are separated by a total of 2.4 µm of the silicon oxide level 230. The lower waveguide 245 of silicon nitride, 250 nm thick, is separated from M1 by 800 nm, and the upper waveguide 250 of alumina, 150 nm thick, is separated from M2 by 800 nm. The vertical separation between the waveguides 250, 245 is 400 nm.

It should be noted in this regard that some design variation may be acceptable regarding the thicknesses of the waveguides 250, 245. For example, in designs with only one waveguide layer, for example waveguide 250 or 245, between the metal layers, for example M1 and M2, variations of as much as ±15%, or even±20%, from the respective, nominal thickness of 250 nm or 150 nm may be acceptable.

Thus, two optical waveguides 250, 245 are routed within 2.4 µm of the level 230 of silicon oxide intermetal dielectric, which is a typical value for the intermetallic dielectric in CMOS processes. Based on the variations in thickness for the elements within the level 230 of silicon oxide intermetal dielectric, the level 230 may have a thickness of 2.4 µm±20%. As a consequence, CMOS metal processes and CMOS via processes can be used in fabrication.

The vertical separation of 400 nm between the waveguides 250, 245 is desirable because it is sufficient to allow chemical mechanical polishing (CMP) between the waveguides 250, 245 without risk of over-polishing into the bottom silicon nitride waveguide 245. More broadly, because there is a manufacturing tolerance for CMP, a vertical separation of 400 nm±50 nm is a desirable objective.

Figure 8:
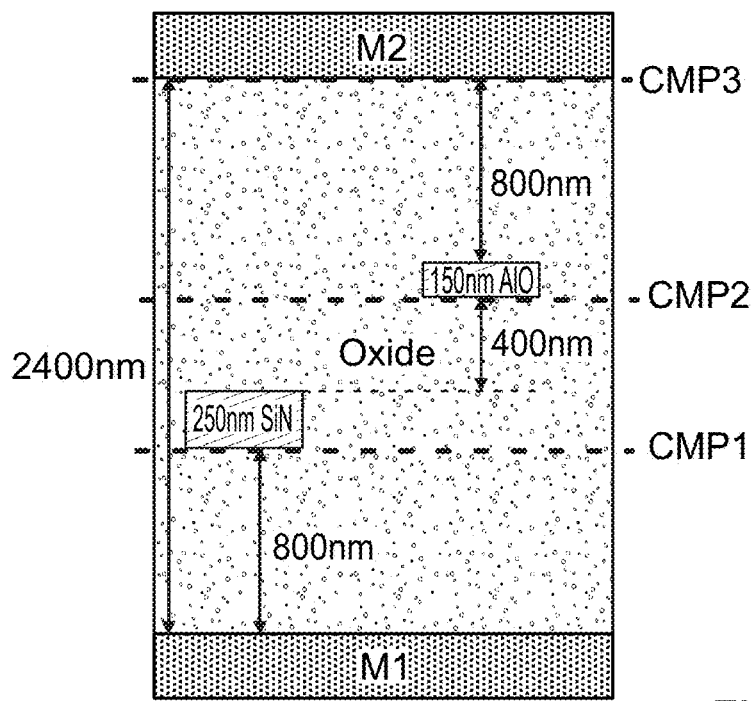
FIG. 8 is a version of the drawing of FIG. 7 that has been modified to indicate, with broken horizontal lines, three levels at which chemical mechanical polishing is applied in the fabrication of the layer structure.

FIG. 8 is a version of the drawing of FIG. 7 that has been modified to indicate, with broken horizontal lines, three levels at which CMP is applied in the fabrication of the layer structure. CMP is an important step for removing topology and surface roughness in the level 230 of intermetal dielectric that is due to the previously deposited metal, for example, M1, and waveguides 250, 245. CMP is also needed to precisely set the thicknesses of the oxide layers within the level 230 of intermetal dielectric. If the oxide layers become too thin, there will be excess optical loss from the metal, for example M1 or M2, but if the oxide layers become too thick, the standard CMOS via etch will fail to reach the bottom metal layer, for example, M1.

In practice, even a single CMP interface such as those indicated in FIG. 8 may require multiple CMP steps, with intermediate measurements of film thickness and additional oxide layer deposition.

For many applications, it is important to have low optical loss in the waveguides 250, 245, especially if propagation lengths in the waveguides 250, 245 are relatively long. This is especially true in applications that use light sources having limited power. This may be the case, for example, when ultraviolet or visible light lasers are used. In applications where waveguides 250, 245 may be up to one centimeter in length, a convenient rule of thumb is that optical loss should be less than 3 dB/cm, so that no more than half of the light is lost. In applications that require substantially longer waveguides 250, 245, there may be more strenuous bounds on acceptable loss.

We performed comparative studies to determine what combination of process parameters for atomic layer deposition (ALD) would produce alumina waveguides 250 with the lowest loss for ultraviolet and visible light in a wavelength range of 369-688 nm. At a representative wavelength of 401 nm, the observed loss was lowest in alumina waveguides 250 deposited by thermal ALD at 300° C. or somewhat more using a heated chuck, and without annealing. The same conditions produced a refractive index in the range 1.674-1.676.

We also performed comparative studies to determine what combination of process parameters for PECVD deposition would produce silicon nitride waveguides 245 with optimum loss and refractive index for visible and near-infrared light in a wavelength range of 688-935 nm. We chose a silane-based, mixed-frequency, plasma-enhanced CVD silicon nitride process. We found that it was effective to include a low-frequency RF component, and also to add argon to the gas mixture.

The silicon nitride waveguide 245 was deposited in an Applied Materials Centura® DxZ 200-mm CVD reactor. The process uses a larger proportion of low-frequency RF power (350 kHz) relative to high-frequency RF (13.56 MHz), and it uses argon dilution to produce high-energy ion bombardment during growth. This results in increased film uniformity, and it produces a film stoichiometry and bonding profile that yield improved loss characteristics.

We varied process pressure, high-frequency and low-frequency RF power, and flow rates of $NH_3$, $SiH_4$, $N_2$, and Ar to optimize film uniformity and to achieve a film stoichiometry and bonding profile that would yield low loss. Example parameters for processing an 8-inch wafer included a chamber pressure of 2.5 torr, an ammonia-to-silane ratio of 2.8, and an argon-to-nitrogen ratio of 1.2. Typical RF power levels were in the range 140 W-250 W for low-frequency RF and in the range 60 W-90 W for high-frequency RF, with typical low-to-high frequency power ratios of about 2.3.

In addition to optimizing the conditions for material growth, we also controlled the patterning and etching of the waveguides 250, 245 to reduce surface roughness and to produce nearly vertical sidewalls.

By way of illustration, an example process we used to fabricate the alumina waveguides 250 from the deposited alumina films used a $BCl_3$/Ar plasma etch, which had good selectivity against the photoresist, thus allowing for relatively fine patterns. Patterning was by a standard CMOS photolithographic process. In examples, a thin bottom anti-reflection coating (BARC) was followed by a 0.73-µm photoresist layer. The pattern was exposed and developed into the resist. This was followed by the etch, which, in an initial step, first cut through the BARC.

Collectively, our efforts led to very favorable propagation losses in optical waveguides at wavelengths from 370 nm to 935 nm. Representative measurements are listed in Table 1:

TABLE 1

| Wavelength | Material | Propagation Loss |
|---|---|---|
| 369 nm | Alumina | 1.35 ± 0.05 dB/cm |
| 435 nm | Alumina | 0.9 ± 0.05 dB/cm |
| 730 nm | Silicon Nitride | 0.37 ± 0.03 dB/cm |
| 935 nm | Silicon Nitride | 0.31 ± 0.05 dB/cm |

In addition to providing electrical interconnectivity, metal features, for example M1, M2, or vias 240 can also be useful in the context of integrated photonics for controlling stray light. That is, stray light from integrated waveguides, for example 250, 245, can couple into neighboring waveguides, for example, 245, 250, where it may create spurious signals. Stray light can also interfere with other integrated devices. In ion-trapping applications, stray light can impinge on the trapped ion 260, creating decoherence or other unwanted effects. The stray light can also scatter into the monolithically integrated photodetector 220 intended to detect fluorescence from the trapped ion 260, obscuring the desired signal or even overwhelming the photodetector 220.

Figure 9:
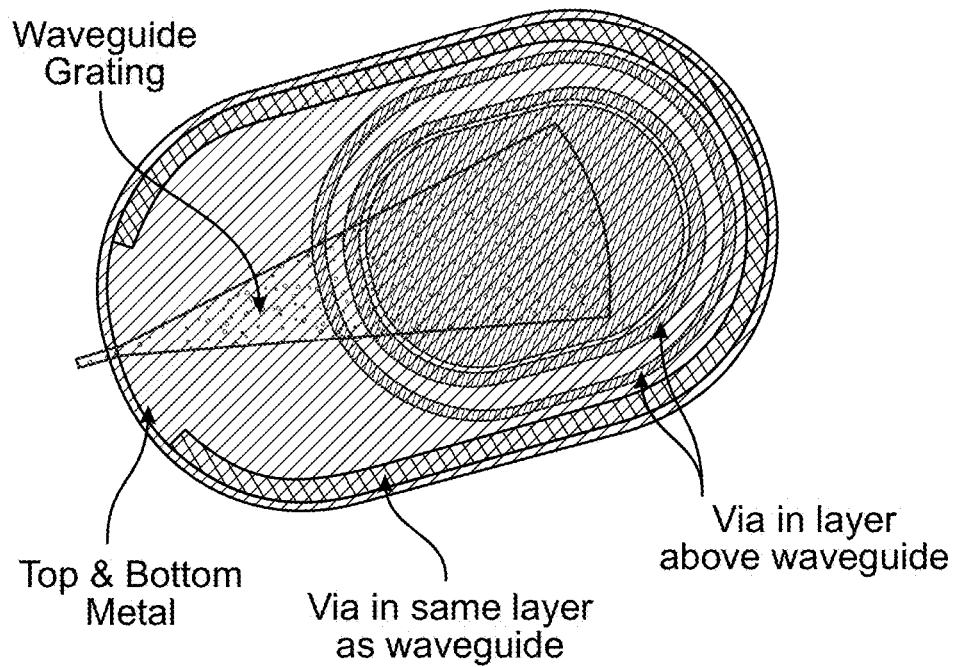
FIGS. 9 and 10 are drawings in plan view that provide examples of encircling baffles and linear baffles around a grating and around a waveguide, respectively.
Figure 10:
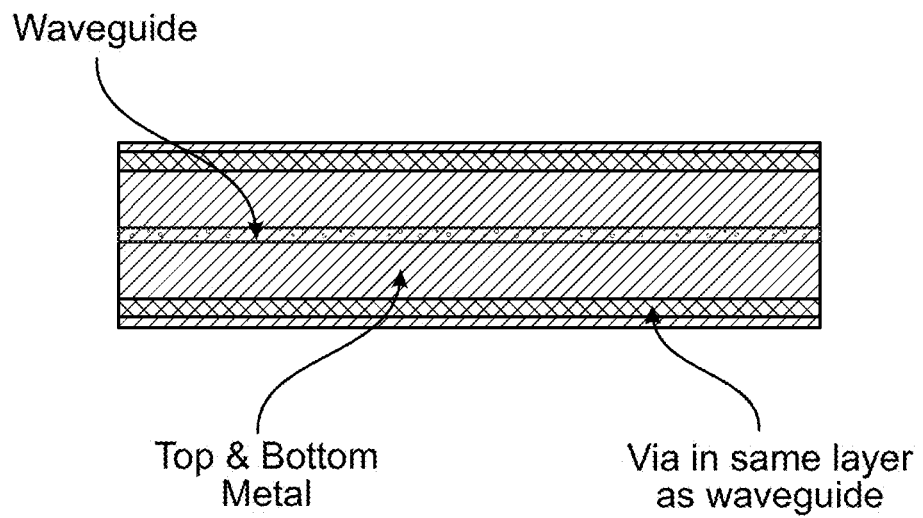

Judiciously placed metal layers, for example M1 or M2, or vias 240 can serve as baffles to block stray light around waveguides 250, 245 and around optical out-coupling features such as a grating 255. FIGS. 9 and 10 are drawings in plan view that provide examples of encircling baffles 910, 920, 930, and linear 1010 around a grating 255 and around a waveguide, 250, 245, respectively. In FIG. 9, a grating 255 is enclosed between overlying top metal M2 and underlying bottom metal M1. An encircling baffle 910 in the form of a via partially encircles the grating 255 in the same level 230 of intermetal dielectric where the grating 255 is embedded. Additional encircling baffles 920, 930 in the form of vias formed in the next-higher level 235 of intermetal dielectric provide further shielding. For example, FIG. 9 shows an "outer" encircling baffle 920 and an "inner" encircling baffle 930 in the level 235 of intermetal dielectric above the waveguide 250, 245. The outer encircling baffle 920 is for optical shielding. The inner encircling baffle 930 in the example of FIG. 9 is a temporary structure used as an etch stop during the fabrication process.

In FIG. 10, a waveguide 250, 245 is shown enclosed between top metal M2 and bottom metal M1, and linear baffles 1010 in the form of vias formed in the same level 230 of intermetal dielectric where the waveguide 250, 245 is embedded.

As pointed out above, the horizontal separation between a waveguide 250, 245 and a metal feature, for example, a via 240, is subject to one of the same constraints as the vertical separation between the waveguide 250, 245 and an overlying metal M2 or underlying metal M1, i.e., at least 600 nm, though the horizontal separation does not have an upper limit of 1200 nm. Because our approach reduces the required separation, we have made it possible to place encircling baffles 910, 920, 930, and linear baffles 1010, close enough to the waveguide 250, 245 to be effective for many applications. In fact, we are now able to compactly create a tunnel with metal walls around a waveguide 250, 245. This is useful for suppressing crosstalk between waveguides 250, 245, and for suppressing crosstalk between a waveguide 250, 245 and a nearby optically active device, for example, a monolithically integrated photodetector 220.

It is noteworthy that because our approach reduces the required thickness of the level 230 of intermetal dielectric in which a waveguide 250, 245 is embedded between metal layers M1, M2, it also reduces the penalty in real estate incurred by adding vias 240 by conventional CMOS processes. That is, the tungsten via plugs that are standard in CMOS fabrication are tapered, and for the via hole to be filled with adequate quality, it must be of at least a certain minimum width. As a consequence, the area occupied by the top of the via plug increases with the thickness of the levels 230, 235 of intermetal dielectric. Thus, thicker levels 230, 235 of intermetal dielectric would dictate wider, non-standard vias 240. A complex circuit may include many vias 240 to provide electrical interconnectivity, to provide etch stops, and for other purposes. In such a context, extra-wide vias 240 could demand a prohibitive amount of real estate on the wafer.

In FIG. 7, we provided an example in which a silicon nitride waveguide 245 and an alumina waveguide 250 were embedded at different levels between metal layers M1, M2 within a level 230 of intermetal dielectric 2.4 μm thick. If the level 230 of intermetal dielectric contains only one waveguide layer, for example the silicon nitride waveguide 245 or the alumina waveguide 250, the level 230 of intermetal dielectric can be made thinner by one waveguide thickness plus the 400-nm standoff distance between waveguide layers 250, 245.

Thus, for example, a single alumina waveguide 250 in a design optimized for wavelengths of 370-435 nm would require a total level 230 of intermetal dielectric thickness of only 1.75 μm, and a single silicon nitride waveguide 245 optimized for wavelengths of 760-935 nm would require a total level 230 of intermetal dielectric thickness of only 1.85 μm. However, it should be borne in mind that the modal profiles at longer wavelengths will extend farther into the level 230 of intermetal dielectric and will therefore be subject to greater loss from interacting with the metal layers M1, M2.

Figure 11:
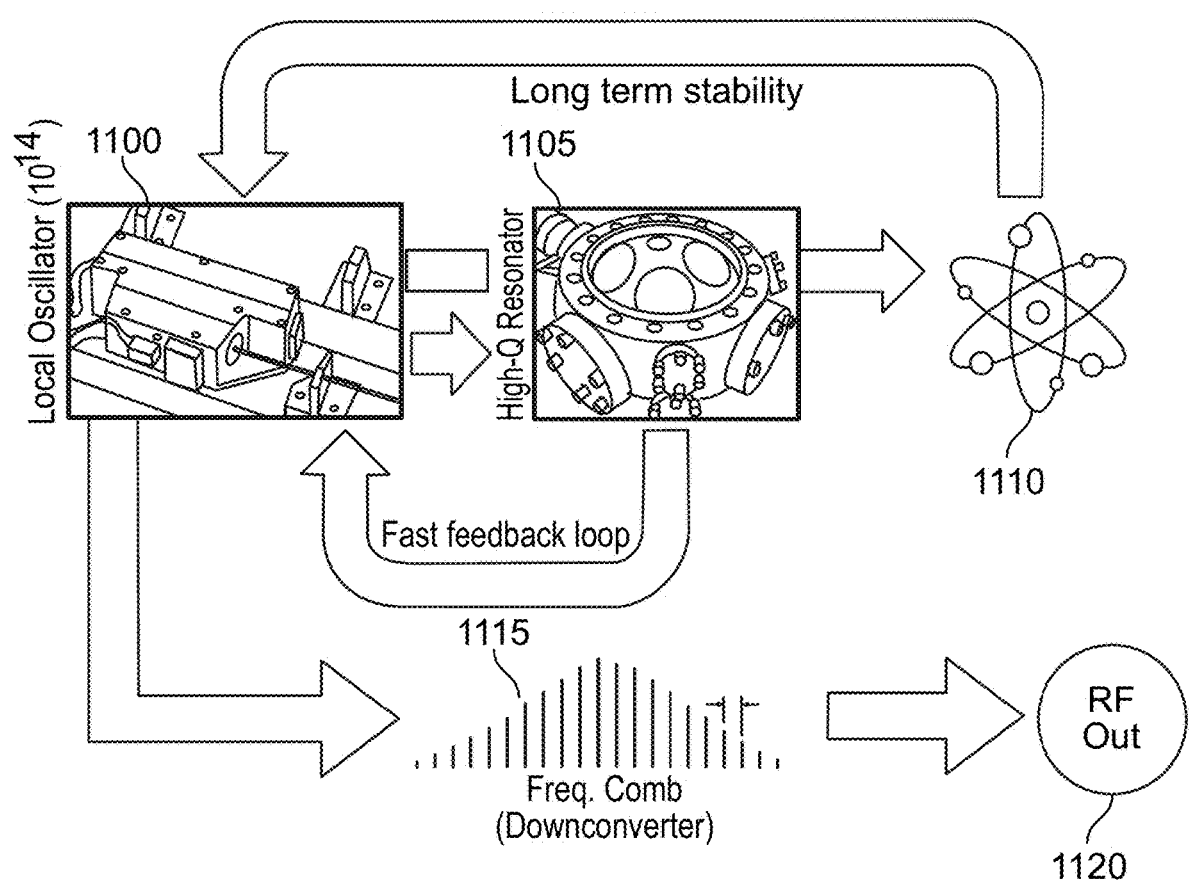
FIG. 11 is a flowchart, providing an overview of atomic clock operation.

FIG. 11 is a flowchart, providing an overview of typical atomic clock operation. As seen, a laser 1100 serving as local oscillator (LO) is stabilized on the shortest timescale by an external, high-Q, optical resonator 1105. On the longer term, the LO is stabilized by interrogation of the host atomic system 1110. The stabilized LO output is downconverted from an optical frequency to an RF frequency through the use of a frequency comb 1115. The downconverted RF signal 1120 is the clock output.

Ytterbium was chosen as the host atomic system for the example embodiment described here because it has several favorable properties. These include a vanishing linear Zeeman shift, which leads to long coherence times and magnetic field insensitivity. Another favorable property is high atomic mass, which dramatically increases trap lifetimes and reduces the impact of electric field noise. Yet another favorable property is a set of optical transitions at wavelengths that are amenable to photonic integration.

The clock transition in this example is the $^2S_{1/2}$ (F=0, $m_F$=0)→$^2D_{3/2}$ (F=2, $m_F$=0) transition at 435.5 nm in the $^{171}$Yb$^+$ ion, which has a 3-Hz Lorentzian linewidth and enables instabilities of less than $10^{-14}$.

Figure 12:
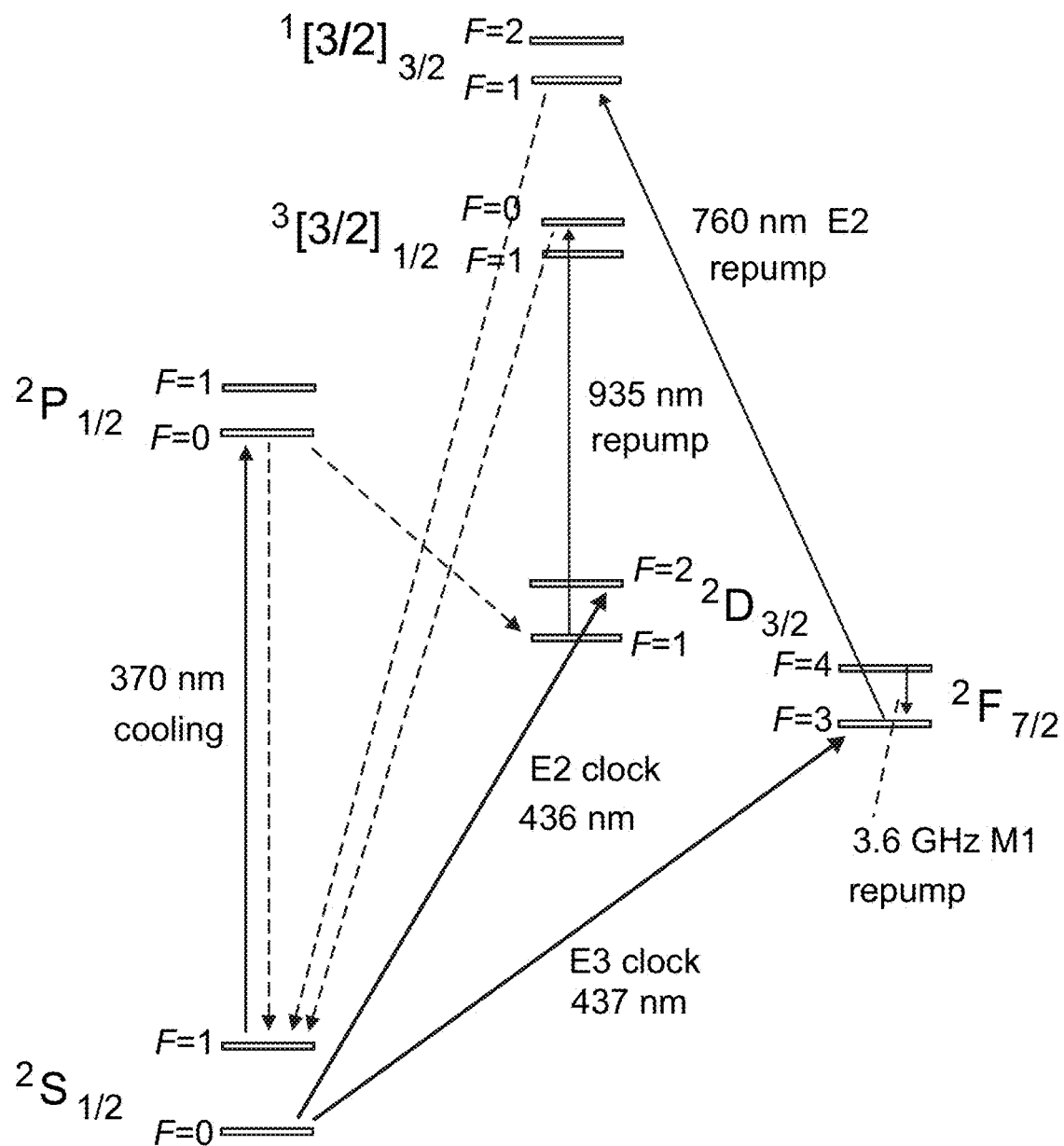
FIG. 12 is an atomic energy-level diagram showing the transitions among hyperfine levels of $^{171}$Yb+ that are involved when $^{171}$Yb+ serves as a host system for an atomic clock as described here.

The level structure of the $^{171}$Yb$^+$ ion is shown in FIG. 12.

Until now, most demonstrations of optical ion clocks have used only a single ion, because it is difficult to control systematic shifts when multiple ions are used. By using a multi-ion approach, however, we believe we can bring about a great improvement in stability.

That is, we believe our multi-ion approach can reduce the stability requirement for the local oscillator (LO) by more than an order of magnitude while maintaining a clock instability scaling of better than $10^{-14}/\sqrt{\tau}$, where τ represents the measurement time. Thus, according to our belief, an optical LO can be pre-stabilized to a high-Q micro-resonator with an instability of $10^{-13}$.

In a preferred mode of operation, an interrogation is performed with two pulses of light at the clock wavelength. The first pulse of light is a π/2 pulse that places the ionic ensemble in a superposition of the two quantum states corresponding to the clock transition, and the second pulse is another π/2 pulse that transfers the ionic ensemble to one of the two states.

This combination of pulses is referred to as a "Ramsey" sequence. However, the different ion ensembles can be operated with different interrogation schemes. For example, the fast ensembles, which provide a lower-resolution error signal, can be interrogated with Rabi spectroscopy (using a single π pulse), which requires less laser power than the Ramsey method.

In a device designed according to our multi-ion approach, there are multiple regions, exemplarily linear arrangements, of ion traps. Individual modulators deliver both the Ramsey pulses and the light used for cooling and detection to each ion site, using waveguides and diffractive out-couplers for optical transport.

For detection, the fluorescence from each ion is collected by an aperture in the trap for delivery to an individual detector.

Figure 13:
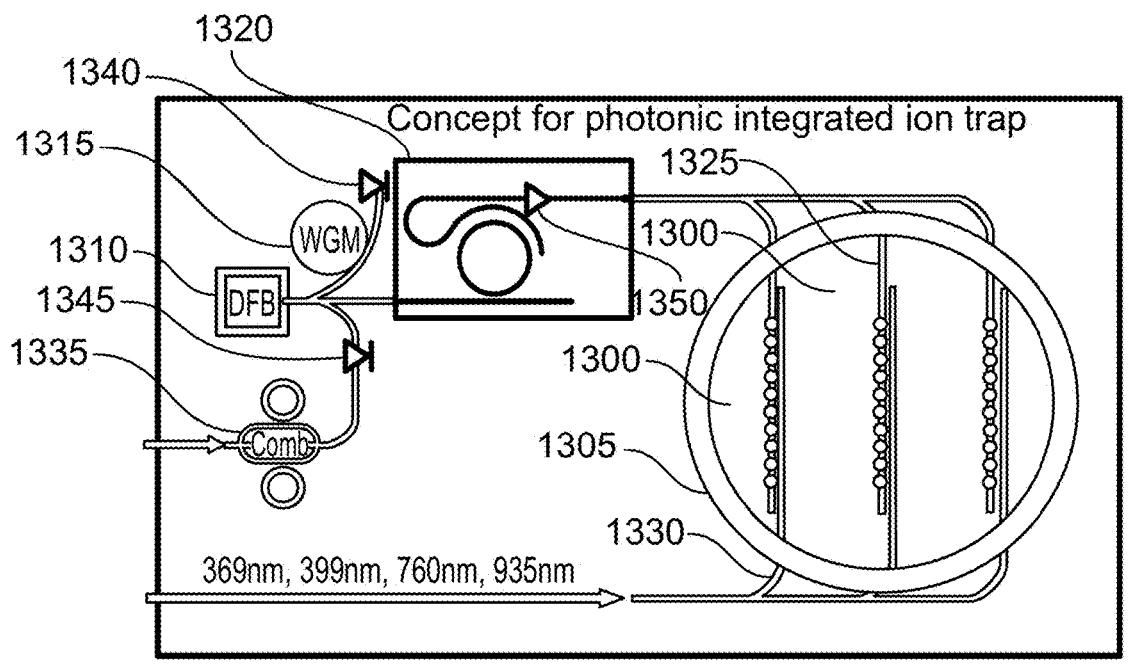
FIG. 13 is a simplified schematic diagram showing an ion trap as described here, in context within an atomic clock system.

FIG. 13 is a simplified schematic diagram showing the ion trap in context within an atomic clock system. Three linear arrays 1300 of trapped ions are shown in the drawing. In embodiments, each of these arrays could constitute an ionic ensemble. The trapping region is sealed within a vacuum chamber. The vacuum seal is represented in the drawing by an annular region 1305.

With further reference to FIG. 13, the local oscillator is the distributed feedback (DFB) laser 1310 shown at left. It is stabilized by an external optical resonator 1315 which in this example is a whispering gallery mode (WGM) resonator. A frequency doubler 1320 is shown between the DFB laser and the trap. Separate laser sources, not shown explicitly in FIG. 13, provide the light at wavelengths of, in this example, 369 nm, 399 nm, 760 nm, and 935 nm that are seen entering the trap from the lower left.

In our example, the DFB laser emits light at a wavelength of 871 nm, which is frequency doubled. For brevity, we refer to the frequency-doubled wavelength in this discussion by the rounded figure of 435 nm. A typical optical power level for the DFB laser output prior to doubling is 40 mW. The output from the frequency doubler will have a typical optical power of 2 mW. Generally, the output from the frequency doubler will be amplified, for example by a semiconductor optical amplifier (SOA) or injection-locked laser, producing an output with a typical power of 50 to 100 mW.

With further reference to FIG. 13, each linear array of trapping sites is shown disposed along a trunk waveguide 1325 for distributing the clock light for interrogating the ions and a trunk waveguide 1330 for distributing the light for re-pumping, cooling, and photoionization. This representation is a conceptual and highly simplified view of a distribution architecture that can be useful in specific embodiments and that is described below in greater detail.

With still further reference to FIG. 13, it will be seen that the optical output of the local oscillator is processed using a frequency comb 1335 to produce a down-converted RF output signal.

Also shown in FIG. 13 are photodiode detectors 1340, 1345 and an optical amplifier 1350. Diode 1345 measures the beat note between the DFB laser and a comb line to produce the downconverted RF output signal. Diode 1340 is a power monitor for locking the DFB laser to the whispering gallery mode resonator. This diode measures how much light is transmitted through the resonator. The measurement provides the error signal for locking the laser to the resonator.

As noted above, there are several advantages to the use of multiple ions. More specifically, using N ions improves the signal-to-noise ratio (SNR) over the single ion shot noise limit of 1 by a factor of $\sqrt{N}$. It also makes the system more robust to ion loss, since the SNR drops marginally for a single ion loss from $\sqrt{N}$ to (N−1), rather than from 1 to 0 for a single ion.

Further, with multiple ions it is possible to operate with several different Ramsey interrogation times. This can potentially achieve greater clock stability by stabilizing the LO with progressively longer interrogation times.

Still further, the detection times can be staggered, thereby eliminating error associated with clock dead time and reducing the cycle time.

With individual ions confined within their own respective trapping potentials, important systematic effects for each ion can be controlled. Examples of such effects are the second-order Doppler shift and the electric quadrupole shift. Moreover, the function of each ion can be alternated between clock operation and environmental monitoring (i.e., monitoring of magnetic and electric fields) at each trap site. Specific ions can also be dedicated for systematic monitoring. Accordingly, the majority of ions can be participating in the clock operation, while a few are instead being used to monitor relevant environmental conditions.

Another advantage is that the clock can be operated with multiple ensembles of ions. This is useful, not least, because it helps to stabilize the local oscillator (LO). As noted above, there can be individual and independent interrogation of multiple single ions. One consequence is that the time r between Ramsey pulses can be different for each ensemble. Each ensemble can then be used to stabilize the LO. This can reduce the LO unlocked stability requirement by as much as an order of magnitude, potentially leading to a much more manufacturable system.

An additional advantage of multiple ensembles is that, if interrogation times can vary among the several ensembles, then the interrogation time for some of the ensembles can be faster than would be possible in a system with a single interrogation time. The faster interrogation time has the benefit of making the clock more robust to vibration.

Figure 14:
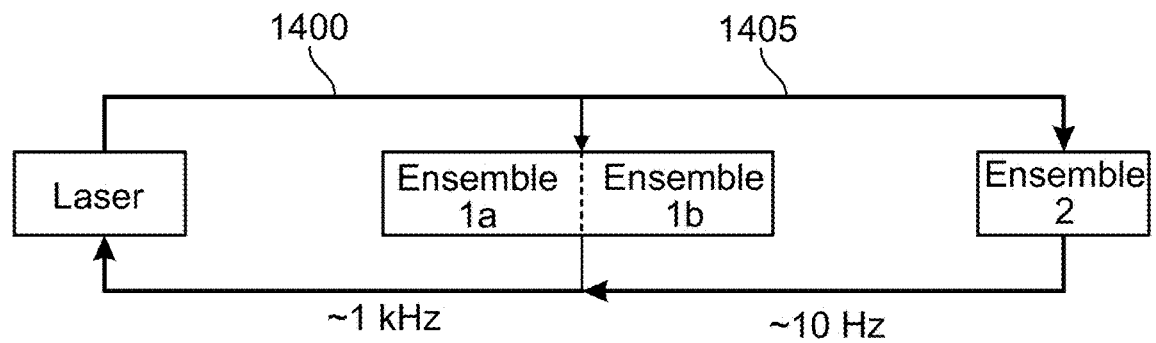
FIG. 14 is a schematic diagram of an optical feedback chain that stabilizes the clock laser in an example embodiment as described herein. An approximate value for an appropriate loop bandwidth is indicated in FIG. 14 beneath each arm of the feedback chain.
Figure 15:
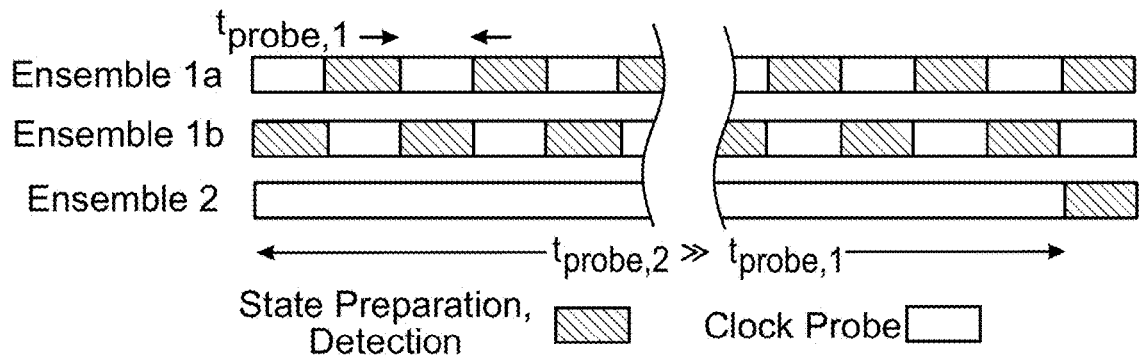
FIG. 15 is a timing diagram that illustrates a probe sequence for the atoms in the respective ensembles labeled 1a, 1b, and 2 according to an example embodiment as described herein.

A simple example of a multi-ion clock protocol which could be implemented with our system is illustrated in FIGS. 14 and 15. FIG. 14 is a schematic diagram of the optical feedback chain that stabilizes the clock laser. There is a fast lock of the clock laser to an external microcavity, which is not shown in FIG. 14. The stabilization represented in FIG. 14 is derived from two separate servos and is based on the atomic interrogation signal. As indicated in FIG. 14, the left arm 1400 of the chain has an approximate loop bandwidth of 1 kHz, and the right arm 1405 of the chain has an approximate loop bandwidth of 10 Hz.

FIG. 15 shows a probe sequence for atoms in the ensembles labeled 1a, 1b, and 2 in FIG. 15. Interleaved dead-time-free probes of ensembles 1a and 1b are used to extend the laser coherence time for ensemble 2.

Figure 16:
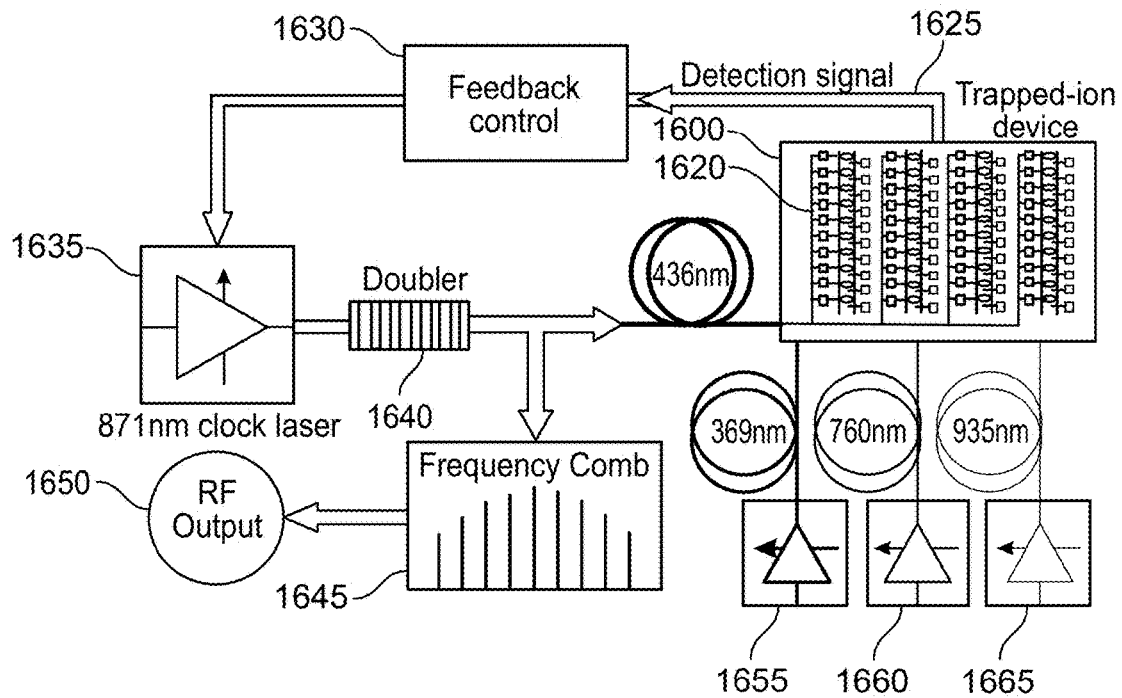
FIG. 16 is a block diagram of an example system for an atomic clock as described herein in a notional overview.

A notional overview of the proposed system is shown in FIG. 16. FIG. 16 is similar to FIG. 13, but some details are complementary between the two figures. A surface electrode ion trap 1600 confines and interrogates multiple ensembles of ytterbium ions. The trapping sites for the ions are arranged so that for each irradiating wavelength or group of similar wavelengths, a trunk waveguide feeds each ensemble and branches out to the individual trapping sites using optical splitters. In the drawing, the trapping sites for the respective ionic ensembles are shown arranged in linear arrays, but this should be understood as merely illustrative and not as limiting.

Waveguides 1620 are integrated into the trap platform with diffractive out-couplers to direct light onto the ions. We have found it advantageous to use focusing grating couplers that can produce small beam waists, preferable beam waists as small as 2 µm. The small beam waist helps to minimize the total optical power delivered to the physics package. This is especially beneficial for the local oscillator source, where the small beam waist will allow for faster optical transitions.

Single photon avalanche photodiodes (SPADs), not shown in the drawing, are monolithically integrated below the traps to read out the states of the individual ions with high efficiency.

A detection signal 1625 from the SPADs is directed to feedback control 1630. The feedback control is used to stabilize clock laser 1635, which in this example emits at a wavelength of 871 nm.

Frequency doubler 1640 doubles the clock laser output to the wavelength of the clock transition, which in this example is 435 nm.

Frequency comb 1645 is used to produce a radio-frequency (RF) output signal 1650 that is downconverted from the clock laser output for precise frequency counting.

Laser 1655, which in this example emits at 369.5 nm, is used for Doppler cooling as well as for exciting the fluorescence used for state detection.

Repump lasers 1660 and 1665, which in this example emit at 765 nm and 935 nm, respectively, support detection and state preparation.

A further laser, not shown in the drawing, emits light at 399 nm to photoionize neutral ytterbium atoms to produce ytterbium ions.

It is noteworthy that by integrating the light delivery and state detection architecture, we have excluded all free-space optics from the clock, except where direct interaction with the ions is involved.

The total number of ions and the total number of ensembles that a clock would use is widely variable and dependent on the particular application. For a particular example, we believe that about fifty trapped ions would be sufficient to implement the multi-atom optical clock described here, although even fewer ions could possibly be useful for some applications, depending, among other things, on the short-term stability of the clock laser.

The Host Atomic System

Because the $^{171}$Yb$^+$ ion has a nuclear spin I=½, it also has a magnetic-field insensitive F=0 hyperfine sublevel, which makes it an attractive choice for a clock. As mentioned above, this also reduces the state-preparation stage to a simpler and quicker hyperfine pumping scheme. The relatively high atomic mass leads to smaller Doppler shifts at a given temperature, and it also leads to increased lifetime in the traps. Ytterbium consistently demonstrates some of the longest lifetimes in trapped-ion experiments.

The $^2S_{1/2} \rightarrow {}^2P_{1/2}$ Doppler cooling and fluorescence detection transition of $^{171}$Yb$^+$ is at 369.5 nm. It has a natural linewidth of $\gamma/2\pi = 19.60(5)$ MHz, which corresponds to a photon scattering rate of 56 MHz.

Because there is a small but significant probability of decaying to the $^2D_{3/2}$ state, a repump laser at 935 nm is required in order to maintain fluorescence.

Although it is optional, a second repump to depopulate the $^2F_{7/2}$ level can help improve ion storage times.

For efficient Doppler cooling, the light used for that purpose must contain a mixture of all polarizations ($\sigma^+$, $\sigma^-$, and $\pi$), although the ratios are not critical. Using an electro-optic modulator (EOM), 14.7-GHz sidebands are applied to the light during cooling and detection to pump out the lower hyperfine level via the $^2S_{1/2}$ (F=0)$\rightarrow {}^2P_{1/2}$ (F=1) transition. The clock operation uses the E2 clock transition at 435.5 nm; this transition has a 3-Hz Lorentzian linewidth that enables instabilities of less than $10^{-14}$.

Detection

The capability for a short detection time, for example a detection time of 30 µs, is desirable. To achieve it, the example design uses single-photon avalanche detectors (SPADs) that have a detection efficiency of greater than 0.2 to collect the ion fluorescence at 369 nm. Assuming, for example, an aperture of 40 µm×60 µm, the fraction of photons incident on the SPAD is 0.061, from which we estimate an average of 20 photons detected in the measurement window.

We have observed a dark count rate from prototypes of our APD in the range 1-10 kHz.

Dark count rate is important because it affects the detection infidelity. Infidelity decreases with the measurement time, but it increases with the dark count rate.

Allowing a dark count rate from the APD of 1 kHz and a detected scatter rate from the laser of 1 kHz, an average of 0.04 false photons detected per measurement window would be expected. Based on these values, and with a detection threshold of 2 counts, we estimate that a detection infidelity of $4\times10^{-6}$ in 30 µs can be achieved.

Integrated Surface Ion Trap

Microfabricated surface traps are good candidates for micro-ion clocks, because they are highly manufacturable, their performance is repeatable due to the lithographic electrode definitions, and they can trap and manipulate many single ions within a trap array.

The ion trap described here can be fabricated using known fabrication technologies in the field of silicon micro-electromechanical systems (MEMS).

It is noteworthy in this regard that in addition to being readily manufacturable, surface ion traps also perform repeatably because their electrodes are lithographically defined. Moreover, the traps are made by a back end-of-line (BEOL) process, which makes their fabrication compatible with many integrated technologies.

A trap chip can support many single-ion trapping sites, each of which can be independently compensated for electric fields. Ions can be loaded in a distant reservoir for on-demand replacement of lost ions. Ions can be moved in and out of interrogation and detection regions to further suppress the off state of the laser radiation illuminating them. Ion shuttling can also be used to share clock laser and detection/repump sites.

In operation, the surface electrode ion trap creates an array of electric potential wells with a characteristic length scale. An illustrative range for this length scale is 20-100 µm, and a typical value in our designs is 40 µm.

For the Yb ion, we calculate that we will be able to achieve well depths in the range of about 0.05 eV to about 0.2 eV.

Each ion is isolated in its own individual well. The wells are typically separated by about five electrodes. Separations between wells are typically on the order of 200 m. Thus, motional coupling between ions is expected to be negligible.

The ions are radially confined by an RF pseudopotential with an amplitude of about 300 $V_{rms}$ driven at a frequency of about 50 MHz. The required RF power to achieve this voltage is typically in the range from about 200 mW to about 500 mW. The RF power is coupled via a miniaturized LC tank circuit. Lower-power operation can be realized through the use of capacitance-reducing techniques for the trap.

With these parameters, the radial secular frequency in examples is about 3 MHz, which would allow an axial secular frequency of about 1 MHz.

Integrated Light Delivery

As noted above, five colors of light are required in the example embodiment described here. Accordingly, five laser sources are integrated into the design: A 435-nm clock laser, a 369-nm laser for Doppler cooling and detection, a 765-nm repump laser, a 935-nm repump laser, and a 399-nm laser for the photoionization beam.

In addition, a single-photon avalanche detector (SPAD, also referred to below as an APD) is integrated below each pertinent trapping site for reading out the ionic state to create the error signal for the clock. During interrogation, the ions in a given ensemble are typically irradiated as a group, but their fluorescence is detected individually by their respective APDs.

In the example described here, the light is delivered to the multiple ionic ensembles by integrated waveguides arranged so that each ensemble is fed by a common trunk that branches out to the individual trapping sites for that ensemble.

In our current approach, two waveguide layers are integrated, at different heights, into the same intermetal dielectric level within the body of a surface ion trap: (a) the 369-nm Doppler beam, the 399-nm photoionization beams, and the 435-nm beam of clock light share an alumina waveguide core, and (b) the 935-nm and 760-nm repump beams share a silicon nitride waveguide layer. The light output from all of these waveguides is directed by grating couplers to the respective trapping sites.

It should be noted in this regard that in alternative designs, the photoionization beam may be delivered to a dedicated photoionization zone.

FIGS. 17-20 illustrate the coupling of a waveguide to a trapped ion.

Figure 17:
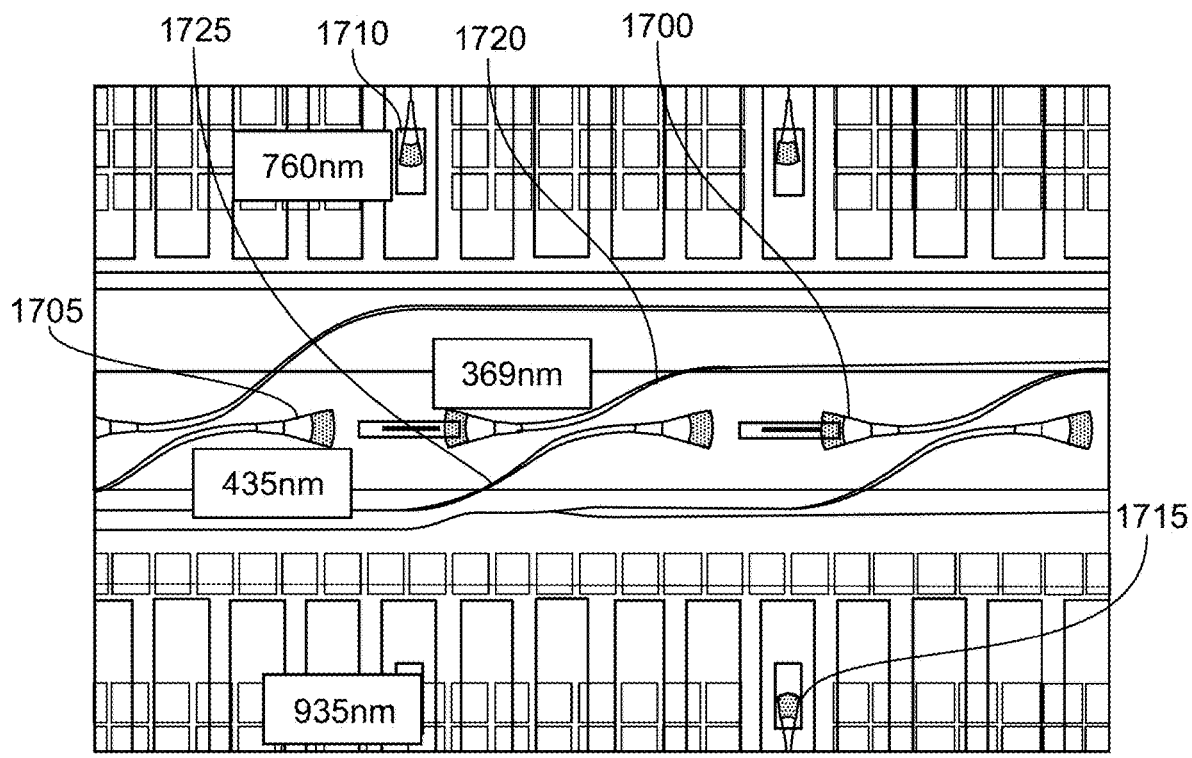
FIG. 17 is a rendering from an optical micrograph of a portion of a trap, showing several output gratings.

FIG. 17 is a rendering from an optical micrograph of a portion of a trap, showing several output gratings. Specifically, output gratings 1700, 1705, 1710, and 1715 for light at 369 nm, 435 nm, 760 nm, and 935 nm, respectively, are shown. Waveguides 1720 and 1725 for 369 nm and 435 nm, respectively, are also visible in the drawing.

Figure 18:
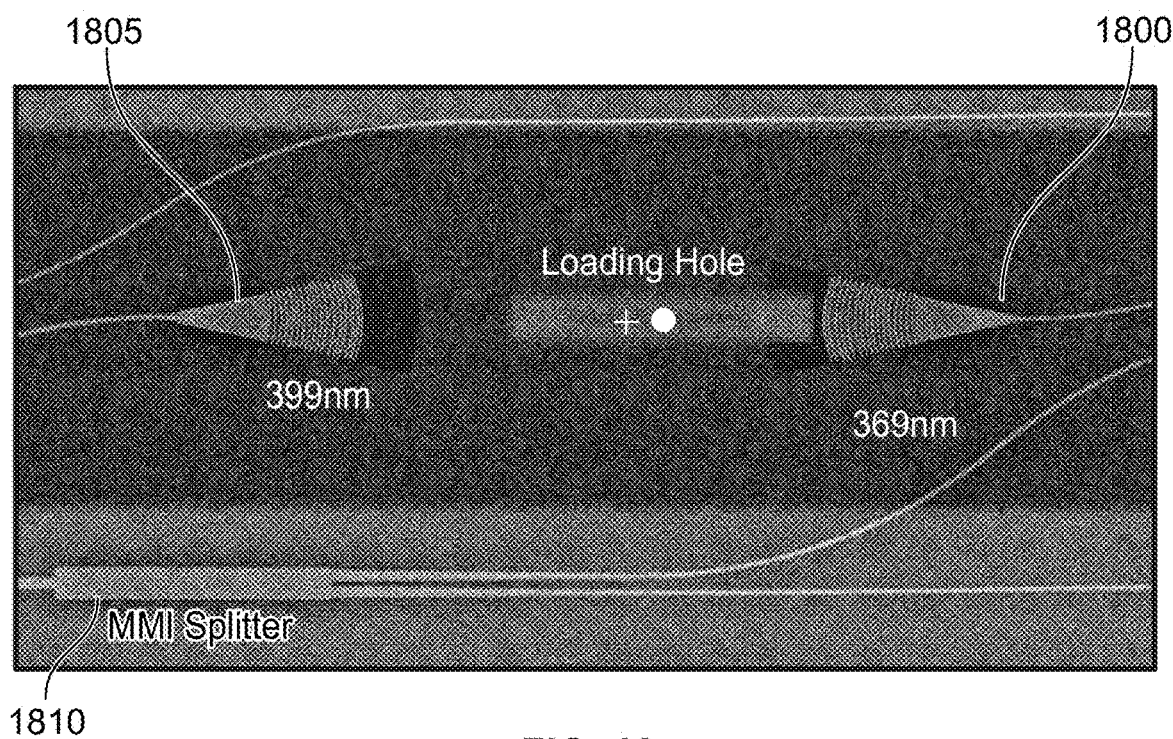
FIG. 18 is a detail of the device shown in FIG. 17, but at higher magnification.

FIG. 18 is a detail of the device shown in FIG. 17, but at higher magnification. FIG. 10 shows output gratings 1800 and 1805 for light at 369 nm and at 399 nm, respectively, together with portions of the associated waveguides and a multi-mode interference (MMI) optical splitter 1810 used for optical distribution from trunk waveguides to branch waveguides. Alternative optical splitting elements useful in this regard include directional couplers and adiabatic splitters.

Figure 19:
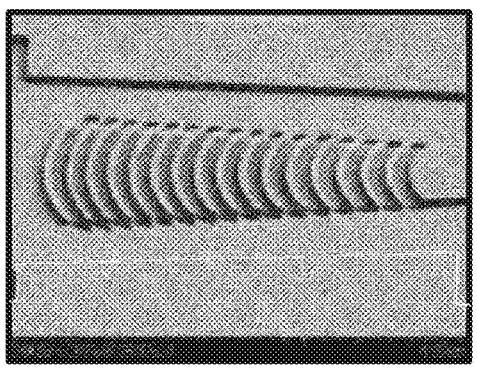
FIG. 19 is a rendering from a scanning electron micrograph of a curved focusing grating coupler integrated into a surface trap according to an example embodiment as described herein.
Figure 20:
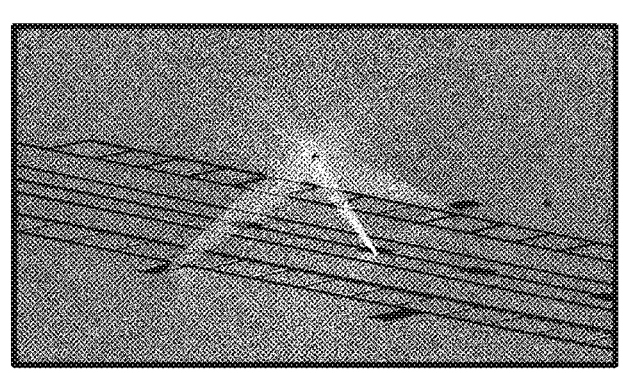
FIG. 20 is a perspective view showing the irradiation of a trapped ion by beams emerging from four respective apertures in the trap.

FIG. 19 is a rendering from a scanning electron micrograph of a curved focusing grating coupler integrated into a surface trap according to an example embodiment as described herein. Simulations have predicted that such a coupler can achieve greater than 90% efficiency at, e.g., 435 nm with a beam waist of 2.0 m. FIG. 20 is a perspective view showing the irradiation of a trapped ion by beams emerging from four respective apertures in the trap.

High optical loss in the alumina waveguides at 369 nm has been recognized as a potential obstacle to achieving desired levels of performance. However, we have established that with careful adjustment of process parameters, it is possible by atomic layer deposition (ALD) to fabricate low-loss alumina waveguides that are transparent at wavelengths as low as 402 and even as low as 369 nm.

Figure 21:
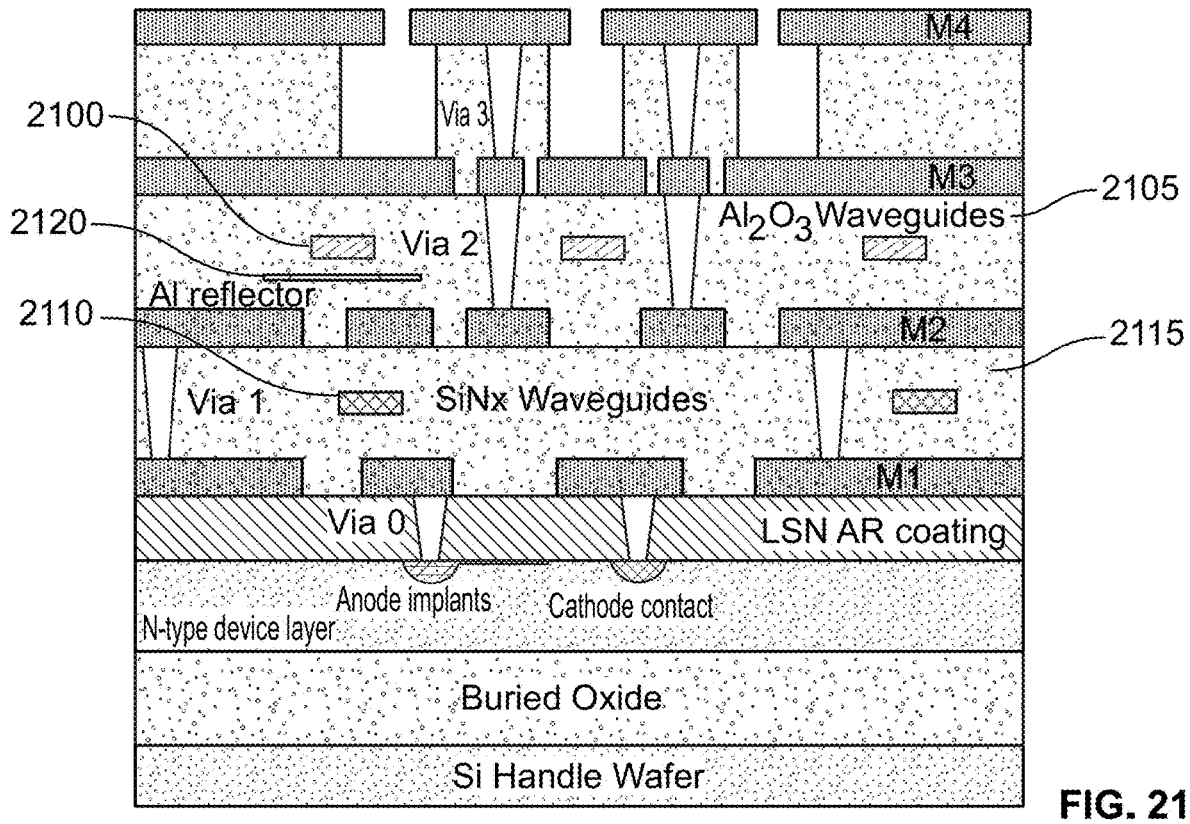
FIG. 21 is a simplified schematic diagram, in cross-sectional view, of a platform in an example embodiment of an ion trap that has four metal layers.

FIG. 21 is a simplified schematic diagram, in cross-sectional view, of a platform in an example embodiment that has four metal layers M1-M4. In the embodiment of FIG. 21, the alumina waveguides 2100 for light at 369 nm, 399 nm, and 435 nm are embedded in the intermetal dielectric 2105 between M2 and M3, and the waveguides 2110 for the repump light at 765 nm and 935 nm are embedded in the intermetal dielectric 2115 between M1 and M2. One possible advantage of placing the different types of waveguides in different levels of intermetal dielectric is that the waveguides can potentially be placed farther away from metal layers which could otherwise add propagation loss.

Aluminum reflectors are an optional feature. FIG. 21 shows aluminum reflectors 2120 embedded in the intermetal dielectric beneath selected alumina waveguides. Although potentially useful for all wavelengths, the reflectors could be especially useful in instances where laser power is limited.

Figure 22:
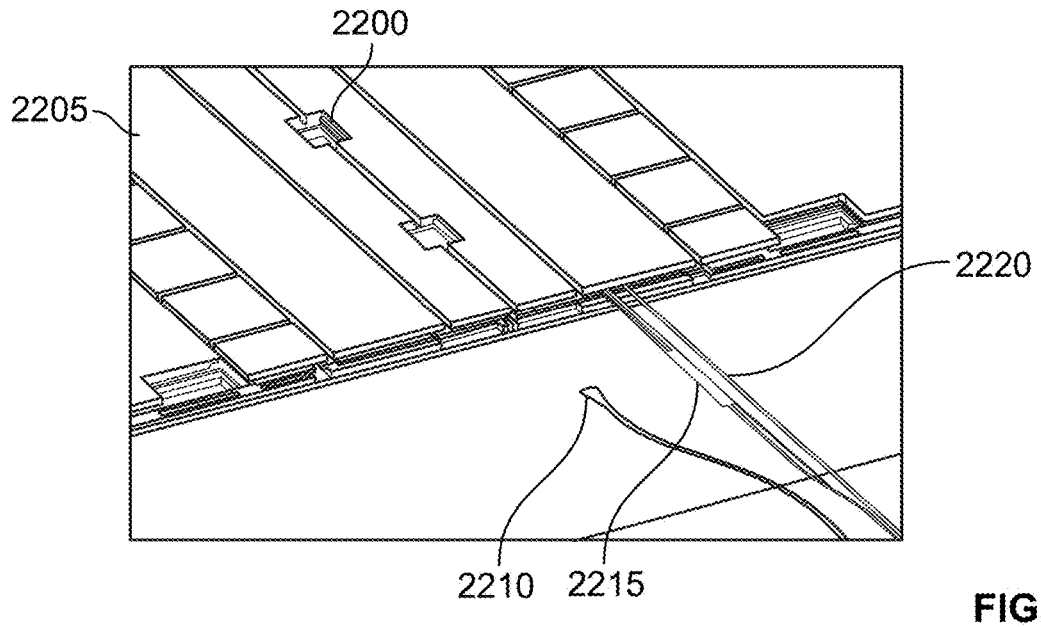
FIG. 22 is a perspective view showing optical apertures that open downward from the top metal in an example embodiment. The view is cut away to expose a portion of the upper waveguide layer, including a grating coupler, an MMI coupler, and portions of several waveguides.

FIG. 22 is a perspective view showing optical apertures 2200 that open downward from the top metal 2205. The view is cut away to expose a portion of the upper waveguide layer, including a grating coupler 2210, an MMI coupler 2215, and portions of several waveguides 2220.

Figure 23:
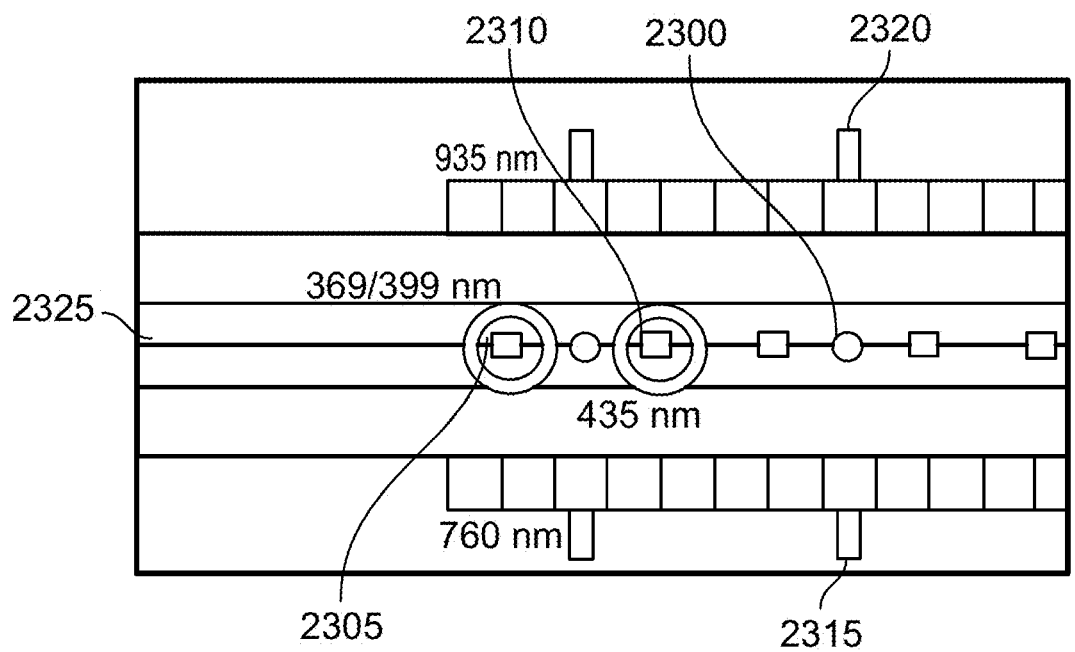
FIG. 23 is a plan view of the device of FIG. 22, showing the locations of the trapped ions, and showing the apertures for light at 369 nm and 399 nm, light at 435 nm, light at 760 nm, and light at 935 nm.

FIG. 23 is a plan view of the device of FIG. 22 showing the locations of the trapped ions 2300, and showing the apertures 2305, 2310, 2315, and 2320 for light at 369 nm and 399 nm, light at 435 nm, light at 760 nm, and light at 935 nm, respectively. It will be evident from FIG. 23 that the light beams at 369 nm and 399 nm, and the light beams at 435 nm, will be directed along the trap axis 2325.

Thus, in particular, the clock beam (at 435 nm) is delivered along the trap axis. This is desirable so that a tightly focused clock beam can impinge the ion even in the presence of fabrication nonuniformity.

One noteworthy feature of our ion trap, in various embodiments, is that scattered light can be suppressed by placing tungsten vias and metal layers around the waveguides to block stray light from impinging on the ion and on the single-photon avalanche detectors.

Optical Coupling

The 435-nm clock laser drives a quadrupole transition. Because quadrupole transitions are relatively weak, a tightly focused beam is desirable to reduce the amount of optical power required at the ion. In preferred designs, we therefore focus the 435-nm beam to a 2.5-μm beam waist, thereby to reduce the power required at the ion to 13 W per site. Simulations predict that a 2.5-μm beam waist is readily achievable using focusing grating couplers, and that an efficiency better than 90% can also be achieved.

Tightly focusing the clock laser at the ion, however, has the drawback that it leaves scant room for aiming error. That is, the output angle of the focusing grating couplers will be sensitive to process variations and may vary accordingly. This cannot be compensated by varying the ion height, because the ion height is fixed by the RF design of the trap. However, come compensation is available by shifting the ion along the trap axis. Hence, we have found it advantageous to illuminate the ion with the clock laser emitted along the trap axis.

With the clock laser beam emitted along the trap axis, shifts in the output beam angle due to process variations can be compensated by linearly shifting the ion position. On the other hand, the repump beams and the beams for cooling and detection can be designed to have a larger beam waist, for example a waist of about 10 μm, which would assure that those beams would intersect at the ion position. This is possible because repump and cooling and detection have low saturation intensities.

For the clock to operate successfully, the intensity of the clock beam must be very uniform over an entire ionic ensemble. Desirably, the ensemble can be interrogated as a unit, without independent control of the optical intensity at each ionic position. However, process variations in the fabrication of the trap can cause variations in the output angles of the grating couplers that affect the optical intensities at the trapping sites.

We conducted preliminary measurements on wafers subjected to our processing, and we found that the shifts in the output angle were correlated over large spatial distances of 10 mm or more. This suggests that complications due to beam nonuniformity can be avoided.

However, approaches are possible that permit the clock to be operated successfully even when beam nonuniformity is significant.

That is, known multipulse protocols can correct for beam intensity errors. A suitable protocol for that purpose is the BB1 composite pulse sequence. See, e.g., C. M. Shappert et al., "Spatially uniform single-qubit gate operations with near-field microwaves and composite pulse compensation," New Journal of Physics, vol. 15, art. no. 083053 (2013), the entirety of which is hereby incorporated herein by reference.

Integrated Waveguides

Silicon nitride ($SiN_x$) waveguides deliver the light at the near-infrared (NIR) wavelengths (i.e., the wavelengths 765 nm and 935 nm in the example described here). A silicon nitride waveguide having low loss for wavelengths in the NIR can be formed by plasma-enhanced chemical vapor deposition (PECVD). The low loss is achieved by tuning the relative flow rate between ammonia and silane during the deposition.

Figure 24:
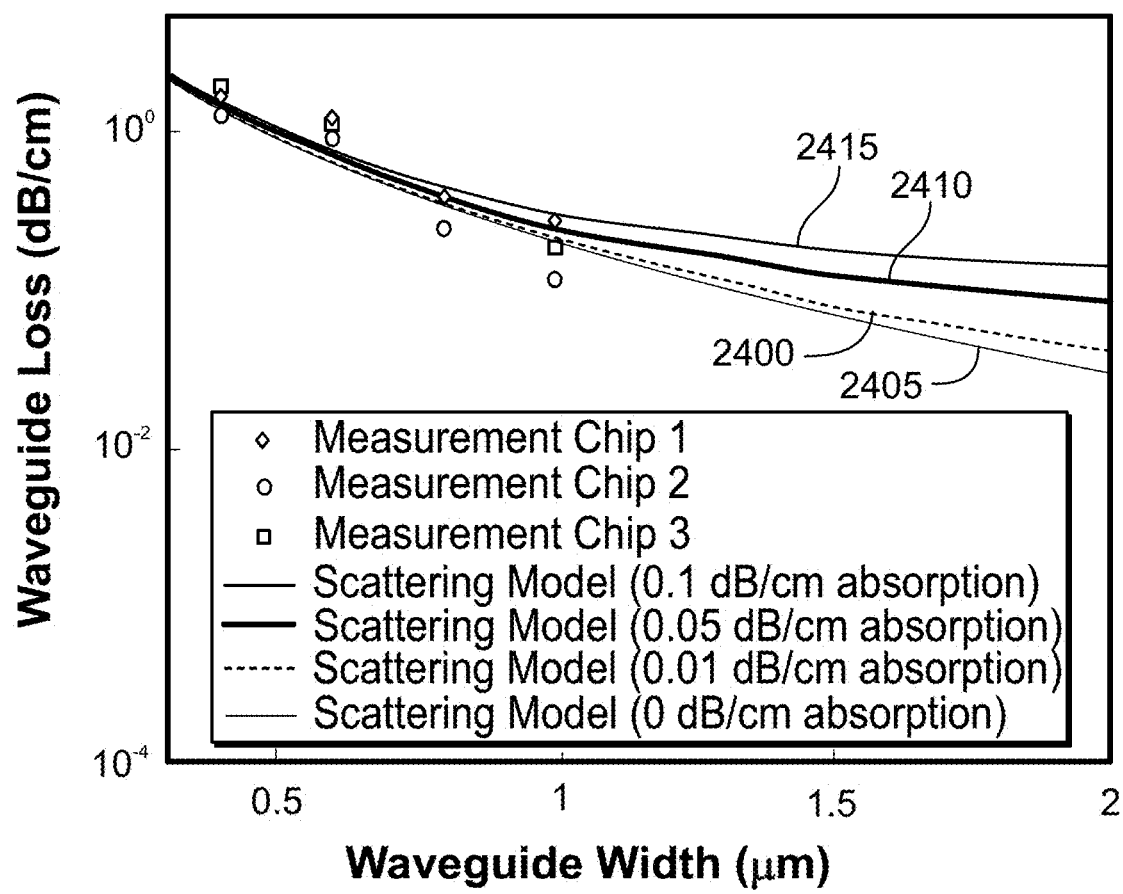
FIG. 24 is a graph of optical loss in silicon nitride waveguides as a function of the waveguide width at a wavelength of about 700 nm. The plotted data points represent experimental measurements. The continuous curves represent theoretical results from four different models for loss due to sidewall scattering and absorption. A best fit to the experimental data indicates that the losses due to absorption are approximately 0.01 dB/cm.

For example, we measured the waveguide loss for wavelengths of about 700 nm in three sample $SiN_x$ waveguides made by PECVD. The results are plotted as a function of waveguide width in FIG. 24. Four continuous curves in FIG. 24 were generated from numerical models for loss due to sidewall scattering and optical absorption. Curves 2400, 2405, 2410, and 2415 were modeled with respective absorption values of 0, 0.01, 0.05, and 01. dB/cm. A best match to the experimental data indicates that the absorption loss was closest to 0.01 dB/cm.

Alumina waveguides deliver the light at the ultraviolet (UV) wavelengths, for example at 369 nm, 399 nm, and 435 nm. When formed by atomic layer deposition (ALD), alumina waveguides can exhibit a wide transparency window extending from the UV to the short-wave infrared (SWIR).

For example, recent studies at Sandia National Laboratories have demonstrated a loss as low as 1.3 dB/cm, or better, at a wavelength of 369 nm in single-mode waveguides having ALD alumina cores.

Alternatively, single-mode silicon nitride wavelengths can be used. We have observed propagation loss as low as 2.5 dB/cm in single mode silicon nitride waveguides at 405 nm.

Figure 25:
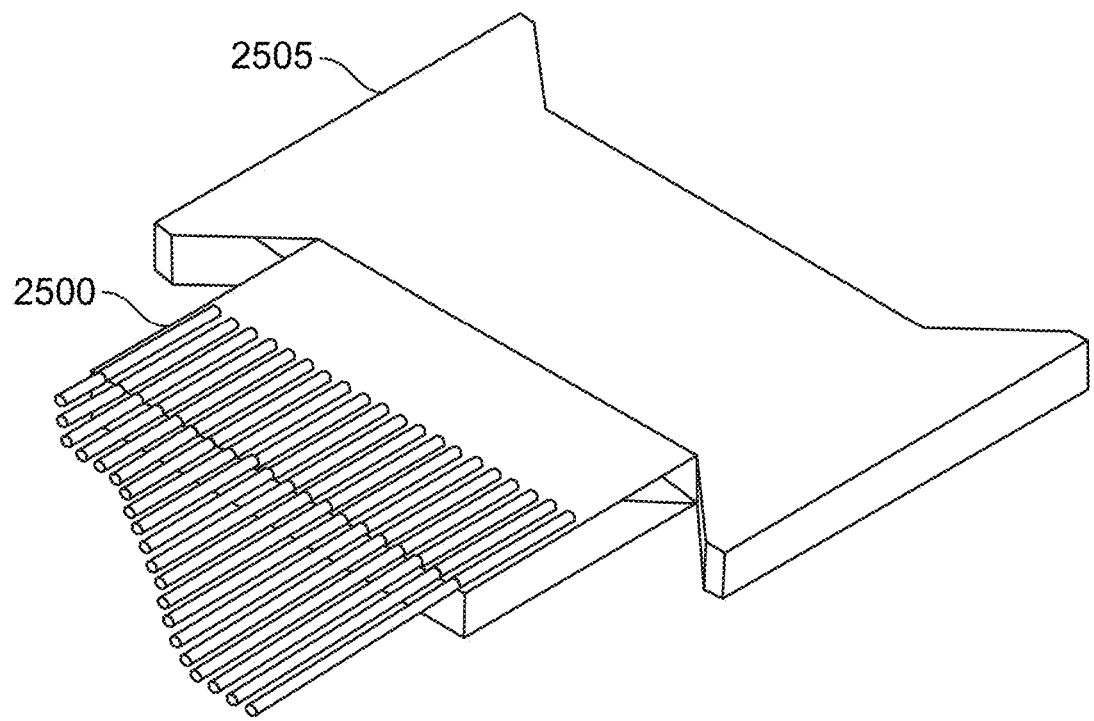
FIG. 25 is a perspective view of an example intermediate wafer useful in some embodiments for coupling of optical fibers.

In our current design, optical fibers are used to transport light from the source lasers to the integrated waveguides, with butt coupling between fiber and waveguide. Several design refinements are also contemplated. For example, an intermediate wafer may be provided that includes V-grooves for fiber alignment to intermediate waveguides formed in the wafer that are coupled to the waveguides in the clock platform. One advantage of an intermediate wafer is that it reduces optical loss by increasing the separation between the optical fibers and the metallization in the clock platform. FIG. 25 is a perspective view of an example intermediate wafer 2500 coupled to the trap substrate 2505.

In another design refinement, the lasers are heterogeneously integrated with the clock platform and directly coupled to it without the use of fibers or an intermediate wafer.

Turning back to our current implementation, we believe that because only a few optical fibers are required to support clock operation, adequate coupling efficiency can be achieved with butt coupling of the fibers to the waveguides. For example, simulations predict that coupling losses better than 0.5 dB will be readily achieved for ALD alumina core waveguides. In practice, we have found that coupling loss as low as 5 dB can be achieved, limited primarily by photolithographic resolution. Taking variations in the fiber core, cladding, and waveguide materials into account, we believe that even lower losses may be achievable, even losses as low as 1 dB.

Integrated Single-Photon Avalanche Detectors

Figure 26:
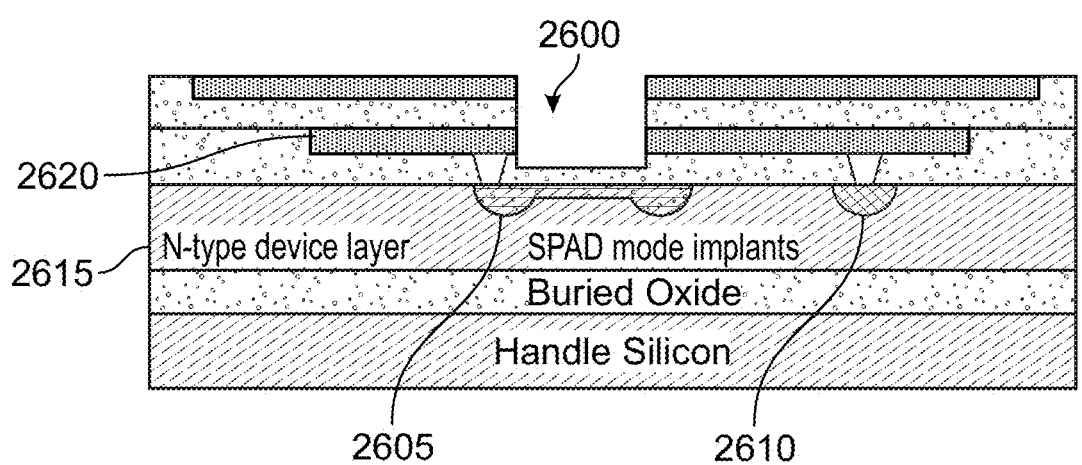
FIG. 26 is a notional cross-section, in elevational view, of a single-photon avalanche detector (SPAD) monolithically integrated in the center of an ion trap according to an example embodiment. For simplicity, only one metal level is shown for the trap electrodes, although multiple levels are required in practice.

As noted above, the detectors are monolithically integrated in our current design, although they may alternatively be added in a hybrid assembly. The monolithic concept is shown in FIG. 26, where the SPAD 2600 is located in the center of the trap. The doping implants 2605, 2610 required to implement SPADs are processed directly into the silicon device layer 2615 of the ion trap, and the first level 2620 of metal is used to route SPAD signals.

We have found it advantageous to subdivide the photodetector at each trapping site into a plurality of sectors, each consisting of a complete SPAD. For example, a single detection site may contain two halves or four quadrants, each containing one SPAD. Subdivision of that kind is useful for isolating defects. We have also found that dark count rates per unit area tend to decrease when using smaller-area diodes.

The SPAD device layer is overlain by a thermal oxide passivation layer and, if desired, a low-stress silicon nitride (LSN) anti-reflection (AR) layer. The AR layer is optional, but it is highly preferred because according to our studies, it can improve the collection efficiency of the detector by as much as 50% or more. The intermetal dielectric is removed from above the antireflection layer to provide an optical path to the trapped ion that is void of material.

Photons are absorbed within about 50 nm from the front surface of the SPAD, generating electron-hole pairs within the p-type anode implant. Good passivation is required to prevent carrier recombination at the surface, so that the photogenerated electrons are able to drift into the high-field avalanche region and initiate a sustained carrier avalanche for Geiger-mode detection.

We have measured the single photon detection efficiency (SPDE) at a 405-nm wavelength and the dark count rate (DCR) for a 10-μm-diameter device as a function of temperature and overbias. We demonstrated an excellent SPDE of 0.7 with a DCR less than 10 Hz for temperatures less than 30° C.

Figure 27:
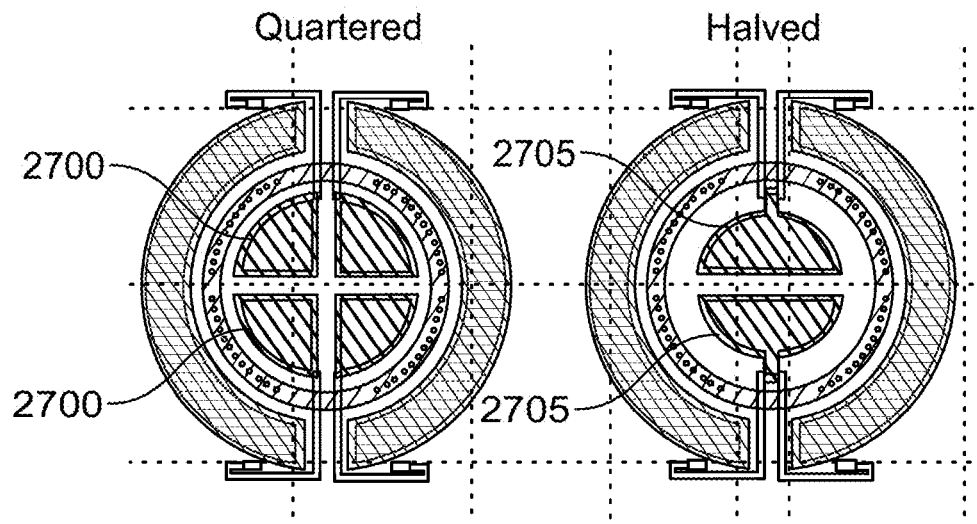
FIG. 27 is a layout diagram for two alternative versions of the SPAD design.

FIG. 27 is a layout diagram for two alternative versions of the SPAD design. On the left, four diode device regions 2700 are arranged below respective quadrants of the trapping site. On the right, two diode device regions 2705 are arranged below respective halves of the trapping site.

Compact Vacuum System

The vacuum package consists of a cap bonded directly to the ion trap chip. The material of the cap is not critical. It could be glass, e.g., borosilicate glass, or in other examples it could be made from a metal such as titanium. A glass window in the top to facilitate imaging of the ions is desirably included if, for example, the spacer, i.e., the remaining portion of the cap, is made from metal.

To bond the cap to the ion trap chip, we first pattern the chip with an annulus of gold over underlying metal adhesion layers. In a current implementation, the sequence of metals is titanium, then platinum, then gold. We also plate the rim of the, e.g., titanium cap with gold in the bonding region. Then the two gold surfaces are soldered together.

To maintain the background gas pressure at the desired level, the ultra-high vacuum (UHV) packaging should include appropriate pumping for the gas loads that arise within the system and that permeate through the vacuum system walls. Active pumping is desirable for management of helium and other noble gases, which passive pumping cannot manage effectively. Remaining gas loads can be managed with bulk non-evaporable getter pumps.

Figure 28:
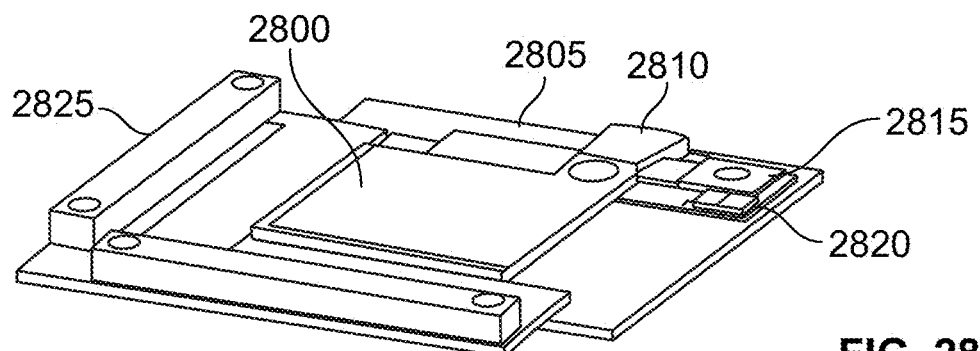
FIG. 28 is a simplified perspective view illustrating an example geometry for packaging an ion-trap platform with connection to a vacuum system. The ion trap substrate is shown mounted on a silicon interposer.
Figure 29:
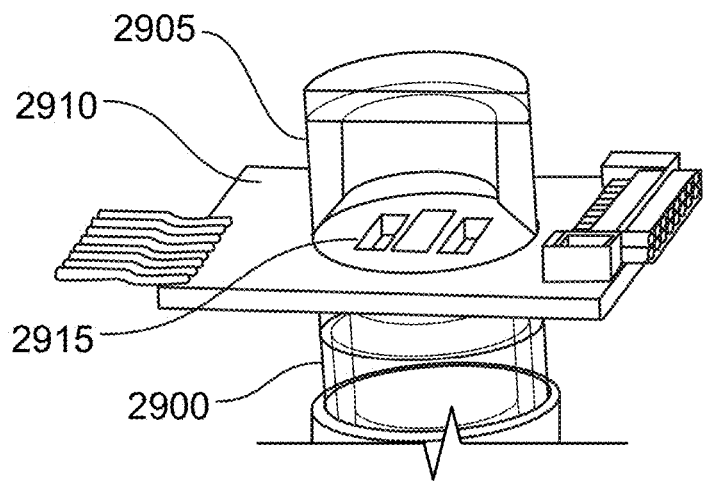
FIG. 29 is a simplified perspective view illustrating an example geometry for packaging an ion-trap platform with connection to a vacuum system. The ion trap is shown mounted on a vacuum inlet.

FIGS. 28 and 29 are simplified perspective views that illustrate an example geometry for packaging the platform with connection to a vacuum system. In FIG. 28, the ion trap substrate 2800 is shown mounted on a silicon interposer 2805. Coupled to the ion trap substrate are the frequency doubler 2810, the local oscillator and external resonator 2815, and the frequency comb 2820. Connectors 2825 for I/O are shown at the edges of the interposer.

In FIG. 29, the ion trap is shown mounted on a vacuum inlet 2900. The cap 2905 is shown bonded to the trap substrate 2910. On either side of the trapping region, apertures 2915 are shown for continuity of the vacuum from one side of the trap to the other.

Routing of Signals

The electrical signals are delivered onto the device substrate by wirebonding to bond pads on the substrate surface. Vias are used for vertical interconnections between the bond pads and buried traces, and between traces that are buried at different metallization levels.

In preferred designs, there are multiple metallization levels to facilitate electrical routing. Our current design has three metallization levels, but as many as five levels are envisaged for future designs, and even more levels are possible.

It is important to note that by using vias for vertical connection to buried metallization layers, we are able to route a large number of electrical signals beneath the vacuum seal for communication between the interior and the exterior of the vacuum chamber, without using any feedthroughs. On the exterior of the vacuum chamber, we can readily fanout the various electrical signals to convenient connection points on an interposer chip or the like.

Optical signals are delivered over optical fiber. In non-limiting examples, the fibers are aligned and coupled using V-groove arrays. Each V-groove is designed to align the end of an optical fiber to the face of a waveguide formed in the ion trap chip.

All electrical and optical connections are external to the vacuum, so as to eliminate the need for feedthroughs and free-space optics.

Yb Source

A miniaturized Yb evaporative source is included within the vacuum package. Any of various designs can be used for the evaporative source. One non-limiting example of an evaporative source suitable in this regard is described in P.D.D. Schwindt et al., "A highly miniaturized vacuum package for a trapped ion atomic clock," Review of Scientific Instruments, vol. 87, art. no. 053112 (2016), the entirety of which is hereby incorporated herein by reference.

The miniature Yb source described in Schwindt et al., cited above, uses a silicon micro-hotplate structure built from a silicon-on-insulator (SOI) wafer. Deep reactive ion etching (DRIE) is used to define a mechanical cup-like holding structure for Yb. Pt/ZnO high-temperature wiring is deposited on the device front side to produce the heating element. Yb is deposited into the hotplate cup using a miniature evaporation process. When the process is optimized, 20% to 40% of the Yb can be transferred into the cup.

FIGS. 30A and 30B provide images of the front (FIG. 30A) and back (FIG. 30B) of the micro-hotplate.

Electrical power can be delivered to the device by either wire bonding or soldering to the gold coated electrodes 3000.

We have demonstrated that we can reduce the size of the micro-hotplate cups to as low as 0.7 mm. A typical fill for the cup is 0.2 to 0.5 mg of Yb.

Operating Temperature

In principle, the ion clock is operable at room temperature. However, cooling may be required if the dark count rate from the photodetectors is excessive at room temperature.

As those skilled in the art will recognize, laser cooling will, in operation, place the trapped ions near their ground state energy. Thus, irrespective of the ambient temperature, the trapped ions will be at an equivalent temperature in the microkelvin range.

Example 1: SPAD Integration

FIG. 31 is a cross-sectional schematic drawing of an example prototype of an ion-trap platform according to the principles discussed here. As seen in the drawing, there are three metal levels whose thicknesses in bottom-to-top sequence from M1 to M3 are 2600 nm, 1350 nm, and 2600 nm. The three layers of dielectric, in bottom-to-top sequence, have thicknesses of 1000 nm, 2400 nm, and 2000 nm.

The silicon nitride waveguides 3100 are 250 nm thick and lie 800 nm above the top of M1 and 1350 nm below the bottom of M2. The alumina waveguides 3105 are 150 nm thick and lie 1450 nm above the top of M1 and 800 nm below the bottom of M2. These dimensions are critical because placing the waveguides too close to the metal layers can cause optical loss.

Figure 32:
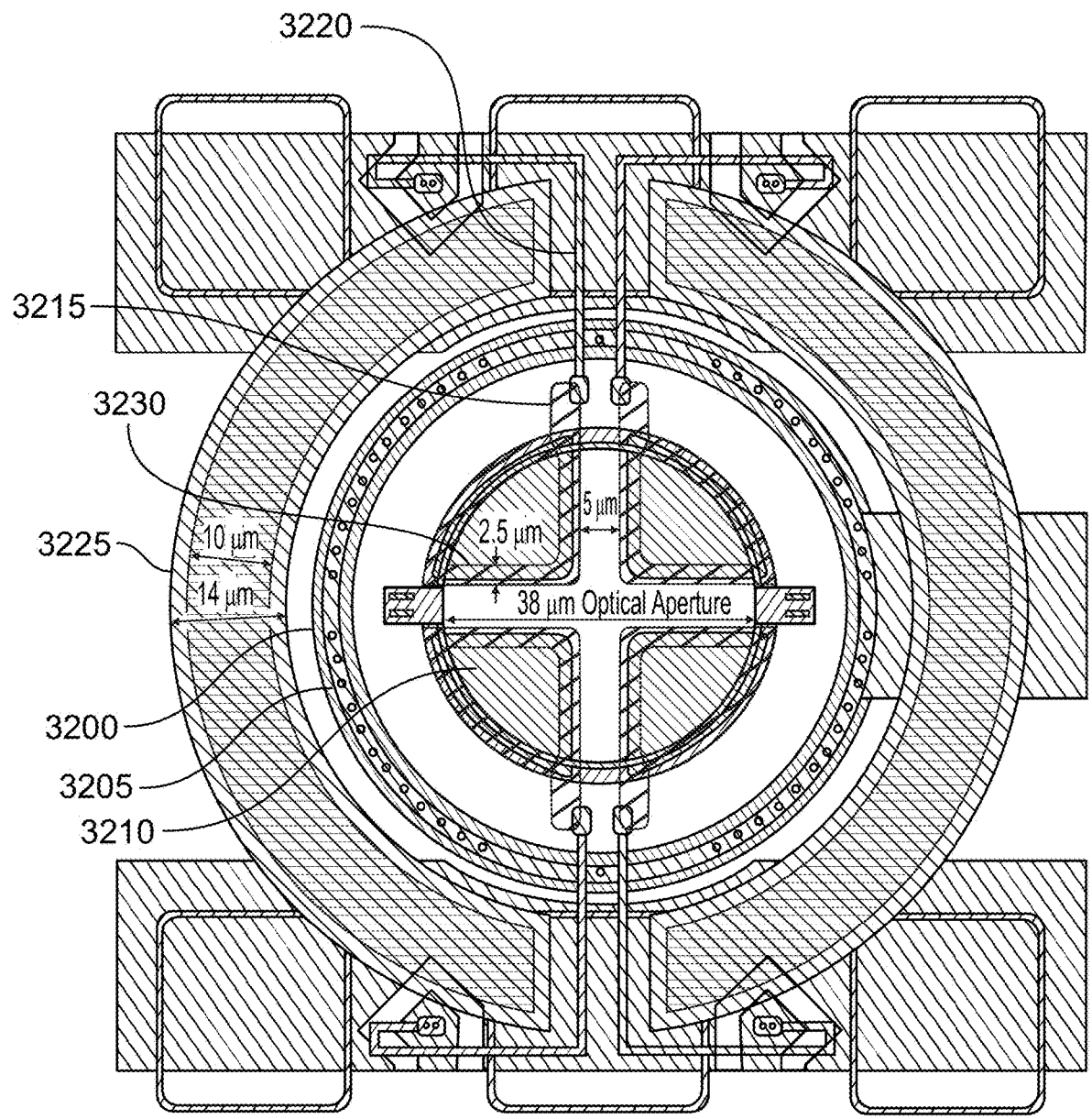
FIG. 32 is a plan view of an example SPAD designed for integration on an ion-trap platform.

FIG. 32 is a plan view of a SPAD that we designed for integration on the ion-trap platform. The optical aperture of the detector is 38 µm in diameter. In order to keep dark-count rate acceptably low, either four or two SPAD devices are employed to fill the optical aperture. We refer to these, respectively, as the "quad" device and the "half" device.

It has been empirically observed that dark count rates increase as a greater-than-linear function of either SPAD area or SPAD perimeter. Hence, a subdivided aperture gives a lower aggregate dark-count rate than a single 40-µm-diameter detector, although this is achieved at the cost of lower aggregate photon detection efficiency (PDE), due to gaps between the individual SPADS.

The SPAD shown in FIG. 32 is a quad device. The best dark-count rate we have measured, to date, for a quad device is 454 Hz. For comparison, our best measured dark-count rate for a half device is 6800 Hz.

Turning to FIG. 32, it will be seen that the elements of the SPAD include a substrate implant region 3200 with substrate contacts 3205, boron-implanted anodes 3210 with anode contacts 3215, polysilicon quench resistors 3220, polysilicon getter 3225, and a 2.5-µm boron deep-implanted guard ring 3230.

The contacts to the anodes are made using implant tabs that are outside of the optical aperture. This is necessary to avoid interference with a continuous tungsten etch stop. The perimeters of the anode implants receive additional deep boron implants (i.e., the "deep guard ring implants") to reduce the electric field and thus prevent premature device breakdown at anode edges.

The polysilicon quench resistors are integrated with the device to quench breakdown events. The resistors are 1 µm wide by 60 µm in total length, providing about 300 kΩ per resistor.

The optical aperture and anodes are surrounded by a substrate contact ring, which serves as the cathode contact to the device.

Surrounding the substrate contact ring is the polysilicon getter. We believe this feature will be useful for removing impurities in the vicinity of the active silicon, although its effectiveness has not yet been confirmed. The getter is a 10-μm-wide ring of polysilicon. This ring fills a trench in the oxide layer that overlies the silicon surface and extends down to contact the silicon surface. To assure that the polysilicon completely fills the trench, it is advantageous to extend the deposited polysilicon to a diameter slightly larger than the trench. As seen in FIG. 32, this produced a 2-μm-wide shoulder on each side of the trench in the example that is illustrated. The ring is broken at top and bottom to allow escape of the quench resistors.

The SPAD is fabricated using standard CMOS techniques that are well known in the art and need not be described here in detail.

The silicon device layer of the SPAD is overlain by an antireflective (AR) layer of silicon nitride and silicon dioxide, which is not shown in FIG. 32.

One of the conventional process steps for fabricating the SPAD involves wet etching to remove the intermetal dielectric of silicon oxide from above the SPAD. We believe that the quality of the AR layer is critical. To protect it during the wet etch, we added a step of depositing titanium nitride (TiN) as a temporary protective layer for the AR layer. The etchant for the intermetal dielectric leaves the TiN in place. A subsequent etching step removes the TiN. This process is described in greater detail below.

FIGS. 33-41 are schematic cross-sections that illustrate selected stages in the CMOS processing to create the ion-trap platform with integrated SPADs.

Figure 33:
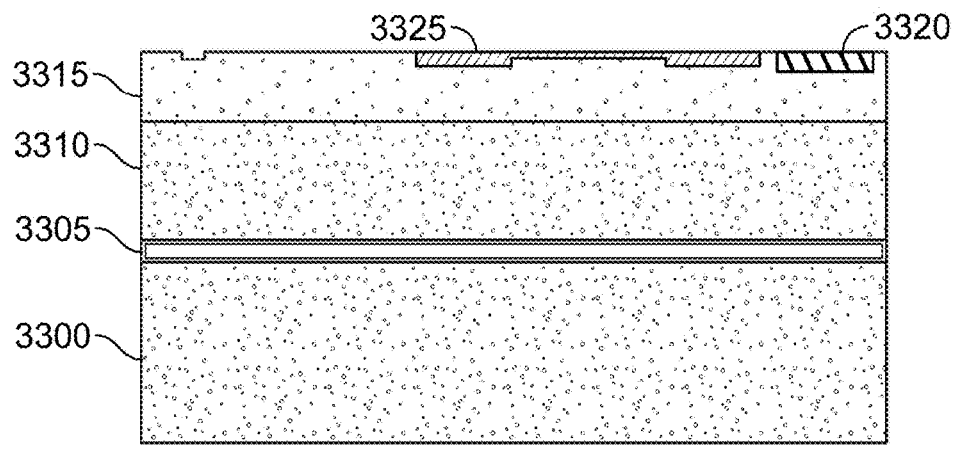
FIGS. 33-41 are schematic cross-sections that illustrate selected stages in a CMOS processing sequence for fabricating an ion-trap platform with integrated SPADs.

At FIG. 33, the starting wafer is shown after boron and phosphorus implants for the active regions and the contacts. An example starting wafer is an SOI wafer with a 700-μm n-type silicon handle layer 3300, a 1-μm buried oxide layer 3305, and a 20-μm n-type silicon device layer 3310 on which there is grown a 5-μm epitaxial layer 3315 of silicon doped with arsenic to $3 \times 10^{16}$ cm$^{-3}$. The n-type phosphorus-doped region 3320 is seen near the edge of the wafer, and the p-type boron-doped region 3325 is seen near the center of the wafer in the view of FIG. 33.

Figure 34:
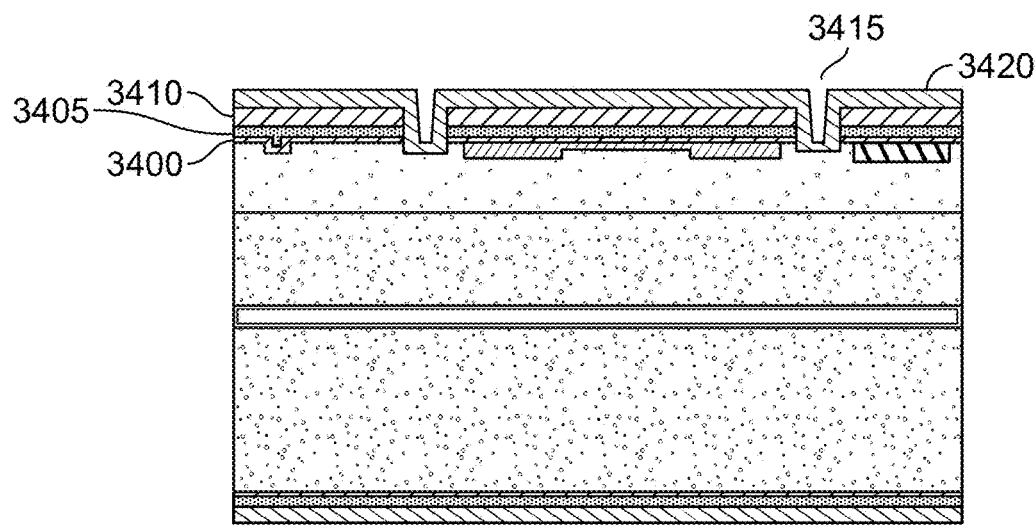

At FIG. 34, the wafer is shown overcoated, in sequence, with a 10-nm layer of thermal silicon oxide 3400, a 32-nm layer 3405 of silicon nitride (SiN), and a 300-nm layer 3410 of HDP oxide. A trench 3415 is etched for the polycrystalline silicon getter, and a 300-nm layer 3420 of polycrystalline silicon is deposited. The thermal oxide and the SiN constitute the AR layer. The polycrystalline silicon constitutes the getter and the quench resistors. Phosphorus is implanted for the resistors, and arsenic is implanted for the resistor contacts.

Figure 35:
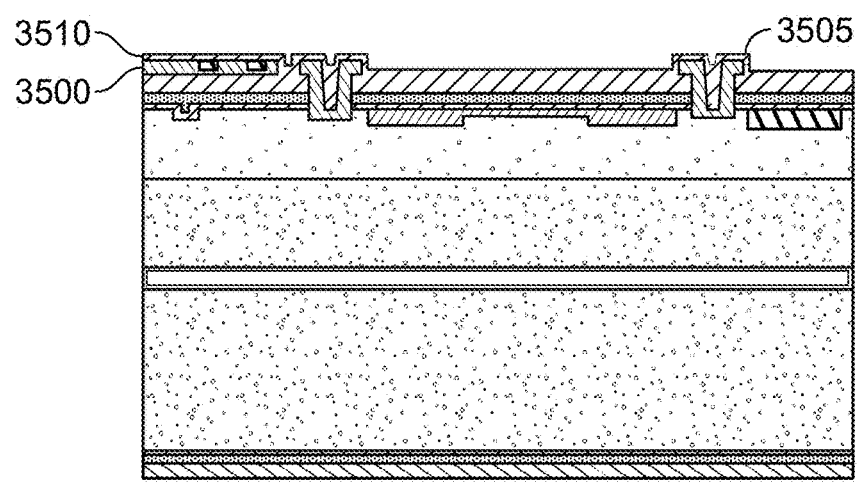

At FIG. 35, the resistors 3500 and the getter 3505 have been defined, and a 100-nm protective layer 3510 of HDP oxide has been deposited.

Figure 36:
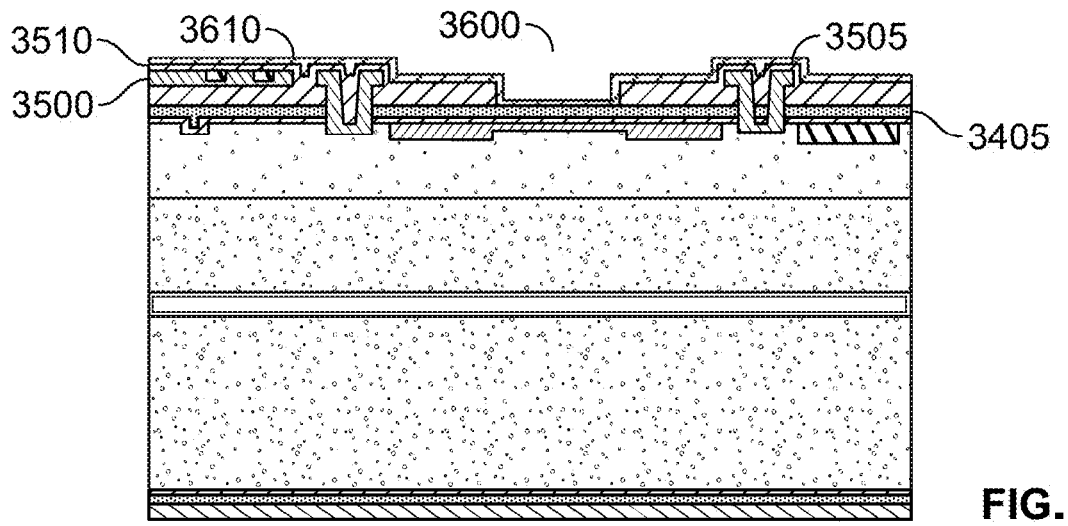

At FIG. 36, an opening 3600 has been etched down to the silicon nitride layer 3405 by a dry etch followed by a wet etch. A 150-nm layer 3610 of TiN has been deposited by chemical vapor deposition (CVD) followed by plasma vapor deposition (PVD).

Figure 37:
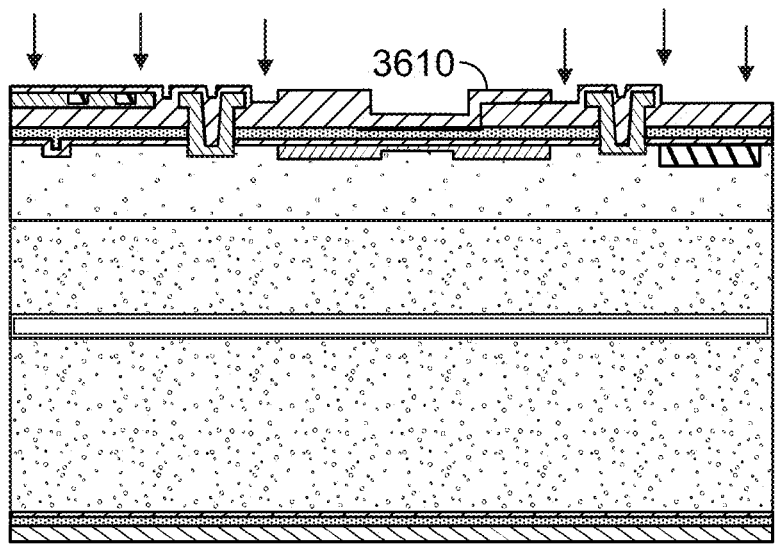

At FIG. 37, the TiN layer 3610 has been defined by wet etching.

Figure 38:
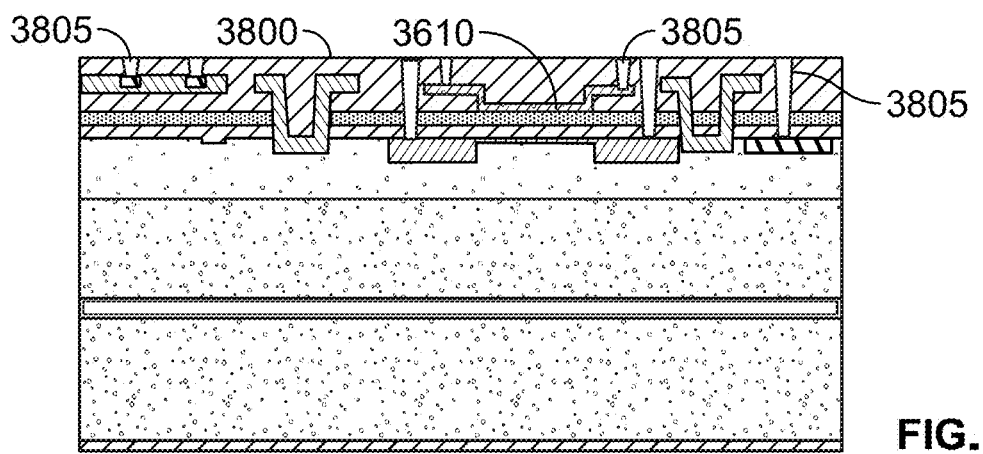

At FIG. 38, a 300-nm layer 3800 of HDP oxide has been deposited, and tungsten vias 3805 have been formed.

Figure 39:
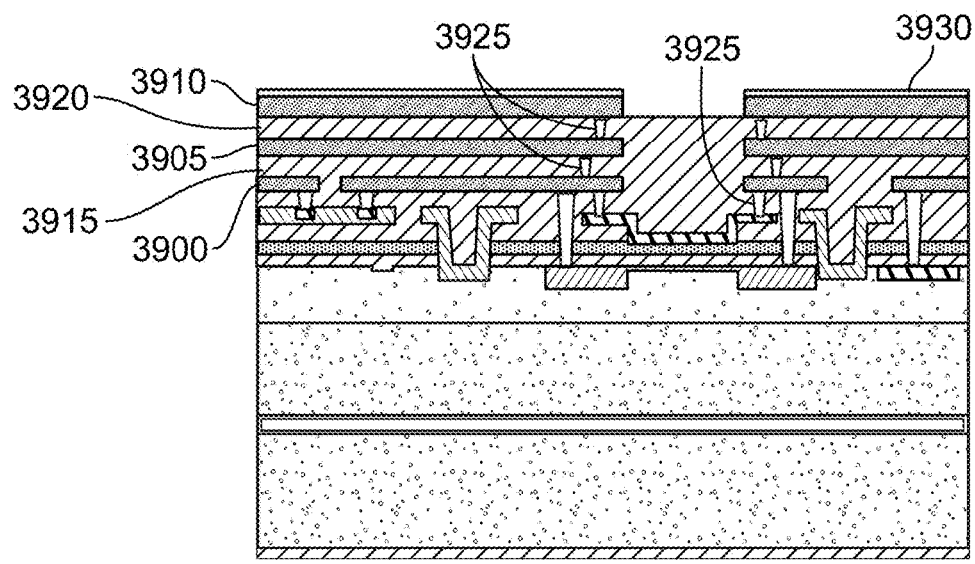

At FIG. 39, layers 3900-3910 corresponding to metallization layers M1, M2, and M3 have been added, together with their intermetal dielectric 3915, 3920, and further tungsten vias have been added, including the sacrificial vias 3925 seen in the drawing. In FIG. 39, a hard mask 3930 of PETEOS is also seen overlying M3. The fabrication of the waveguides is not shown in this series of drawings.

Figure 40:
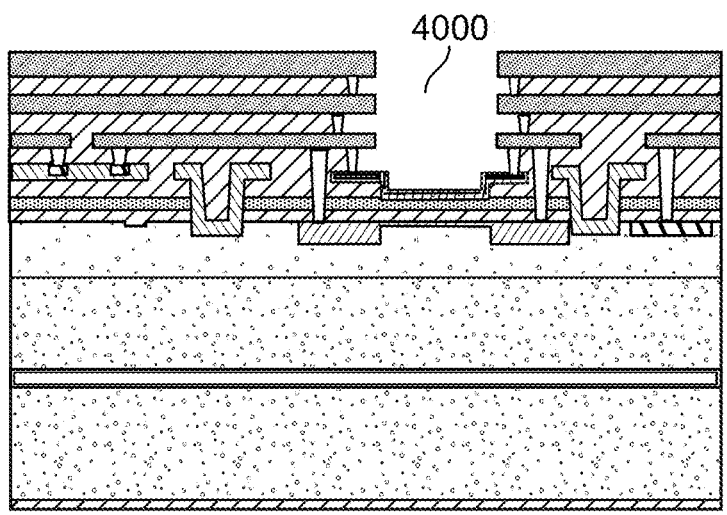

At FIG. 40, the etching process that releases the traps has also opened the aperture 4000 (i.e., the optical window) down to the TiN layer.

Figure 41:
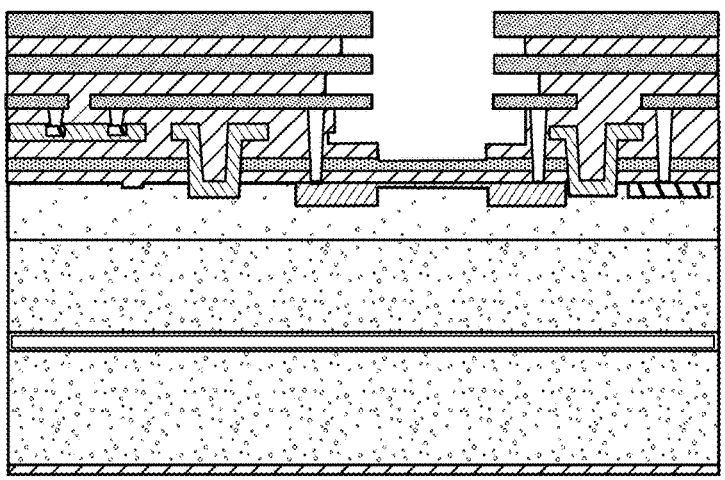

At FIG. 41, further etching removes the sacrificial vias and the TiN layer.

In the example, the alumina gratings for light at 369 nm and for light at 435 nm are designed for a beam angle of 46.1° from the normal, focused on a spot at a height of 50.4 μm with a full width at half-maximum (FWHM) of 4.6 μm for the 369-nm light and a FWHM of 3.3 μm for the 435-nm light.

In an example design, the 300-nm light is carried by the same waveguides that carry the 369-nm light. In an alternative design, a dedicated waveguide delivers the 399-nm light (which is used solely for photoionization during ion loading) to a special trapping site where the photoionization takes place. The ions are shuttled from there to the trapping sites for the clock.

The silicon nitride gratings for light at 760 nm and 935 nm are designed for a beam angle of 200 from the horizontal. They are designed for a relaxed focus at the ion height of 50.4 μm. In design variations, a collimated beam could be used in place of a focused beam.

Figure 42:
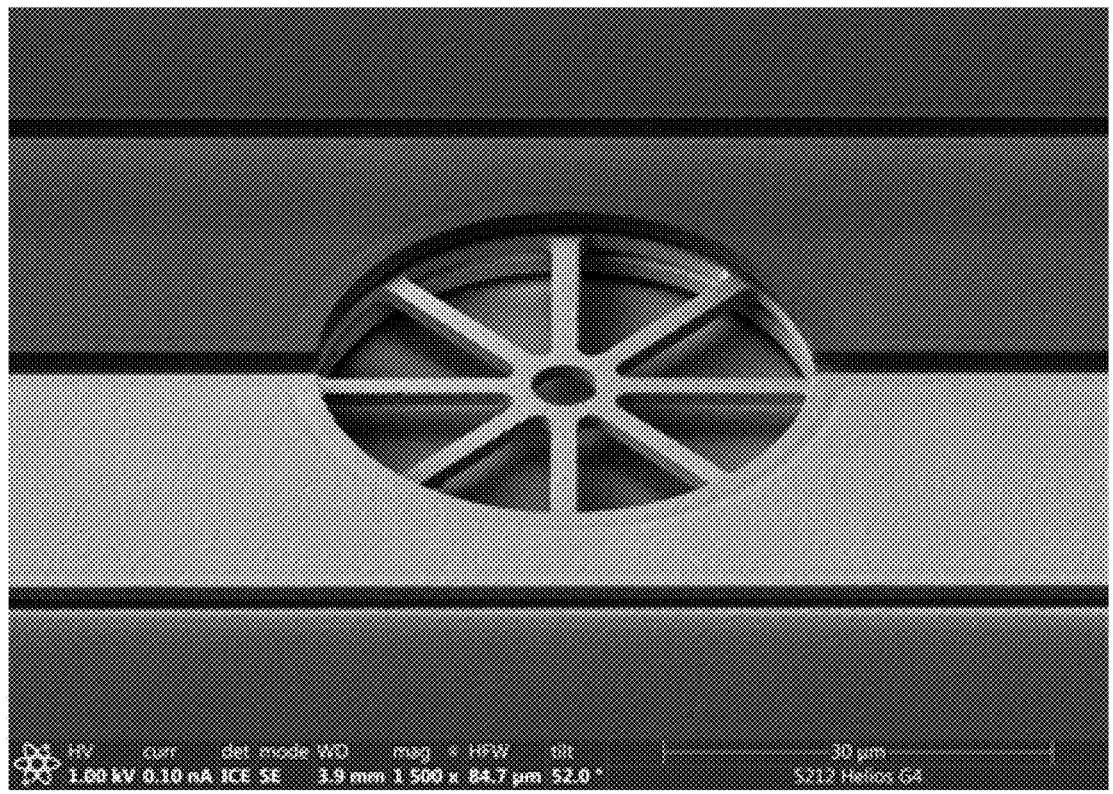
FIG. 42 is an optical micrograph of an example SPAD with a mesh to provide electric field shielding.

It has been discovered that the electric fields generated by a SPAD, such as that illustrated in FIG. 32, may interfere with the ability to trap and maintain an ion above the SPAD. These electric fields may be relatively large due to the large biasing voltage (~30 V) required for operation of the SPAD. The bias voltage will fluctuate by several volts every time a photon is detected, further exacerbating the noise. While the SPAD could be covered by a grounded metal plane, this would prevent light from reaching the SPAD. To provide electric field shielding while allowing light to reach the SPAD, a metal mesh in the top metal layer M3 (3910 in FIG. 39) may be included as illustrated in the optical micrograph of FIG. 42. As illustrated in FIG. 42, the metal mesh is suspended above the SPAD, while the porosity of the metal mesh allows light to fall on the active portion of the SPAD, i.e., the anodes 3210 illustrated in FIG. 32. While the metal mesh in FIG. 42 has a hub and spoke configuration, other embodiments may employ, for example, a rectilinear mesh having a first set of parallel "wires" running in a first direction and a second set of parallel "wires" running in an orthogonal second direction. In each case, the metal mesh is grounded.

Example 2: Grating Coupler Design

We designed optical grating couplers to produce beams that would diffract from the gratings in such a way as to focus at the location of the trapped ion. The design angles and spot sizes for the five different wavelengths that we used are listed in Table 2 below.

For each of our designs, the desired focal point was 50.4 μm above the surface of the top metal of the ion trap. To reduce stray light from the 369-nm beam, we choose a non-focusing design (i.e., a design with focus at infinity) for that wavelength. We also chose non-focusing designs for the near-infrared wavelengths, because those wavelengths did not require high intensity.

We tried several different design techniques for the gratings.

One technique that we tried was the apodization technique described in K. K. Mehta et al., "Precise and diffraction-limited waveguide-to-free-space focusing gratings," Scientific Reports vol. 7, https://doi.org/10.1038/s41598-017-02169-2 (2019), the entirety of which is hereby incorporated herein.

Another technique that we tried was an adjoint optimization routine, utilizing the lumopt Python package, described in C. M. Lalau-Keraly et al., "Adjoint shape optimization applied to electromagnetic design," Optics Express, vol. 21, pp. 21693-21701 (2013), the entirety of which is hereby incorporated herein.

However, our most successful designs were based on an iterative technique of our own devising. According to that technique, each grating tooth is defined by finding that curve which maintains a constant effective optical path length for propagation from the input of the grating slab, through any point on the grating tooth, to the desired focal point.

Each grating tooth has an effective index of refraction with a value between the index of the surrounding cladding material and the effective index of an infinite 2D slab of the waveguiding material. This grating-tooth effective index will affect the optical path length of light which passes through it and scatters from downstream grating teeth. As a consequence, each grating tooth must be defined after the previous grating teeth have been defined, based on an optical path length calculated using the effective indices of the previous teeth. These sequential calculations make our procedure iterative in nature.

A better understanding of our procedure can be obtained with reference to FIGS. 43 and 44. As seen in FIG. 43, we begin with a tapered waveguide region which extends in the xy-plane from the input waveguide at location (0,0,0). The tapered waveguide region expands in the xy-plane with increasing distance along the x-axis, up to a limit defined by the length L, which sets the location of the end of the taper region along the x-axis.

With further reference to FIG. 43, the total optical path length associated with the location (L,0,0) is (A+B). The length (A+B) is calculated as the sum of:

the length of the taper (L) multiplied by the effective index of the waveguide slab (neff), plus a weighted value of the distance from the end of the taper to the focal point, where the weighted value is obtained by multiplying the distance by the refractive index of any material located along this path.

This path length is divided by the wavelength and rounded to the nearest integer to provide a grating tooth order number, m.

We then solve for the curve which remains in the plane z=0 and maintains this constant path length. In the case of constant effective index along optical path lengths A and B, this corresponds to the intersection of an ellipsoid of revolution (i.e., a spheroid) and a plane. For the generation of grating teeth, however, the effective index along the path length varies. As a consequence, the solution becomes non-analytic.

Once this curve has been determined, it is used to draw the end of the tapered region with a defined transverse width (i.e., taper angle). The first grating tooth is then generated by increasing the order of the grating tooth by one unit (i.e., m→m+1). This provides an incremental increase of one optical wavelength in the optical path length.

A new curve is numerically generated in the plane z=0 and designed to maintain this new path length between the grating input and the focal point. With reference to FIG. 43, the effective optical length A is now the sum of:

the effective index of the waveguide slab (neff), multiplied by the taper length L, plus an additional path length from the end of the taper region to the first tooth, multiplied by the effective index of this additional path length.

The effective index of this additional path length is estimated using a weighted average of the slab waveguide effective index and the index of the cladding material, based on a desired grating duty cycle (DC).

In the current example, the duty cycle DC was maintained constant from tooth to tooth of the grating. However, it is noteworthy in this regard that in principle, the duty cycle could vary from tooth to tooth. Such variation has the potential advantage of modulating the scattering strengths of the affected teeth, and thus could potentially allow shaping of the intensity profile of the scattered light for better performance.

It should be noted in this regard that although the duty cycle was constant in this example, the tooth width was not. The tooth width changes because the spacing between teeth changes. That is, the spacing changes along the length of the grating, and also within a single pair of grating teeth.

In a more complex but potentially more accurate procedure, the effective refractive indices of the teeth are refined through iteration. That is, after initially calculating the grating tooth curve based on the estimated effective index, a new effective index of the tooth is calculated based on the current iteration of the curve and used to generate a new curve for the next iteration. This procedure is iterated to reach a desired level of accuracy.

The curve in its final iteration is then used to draw the first grating tooth. The grating tooth order is again increased by one unit, and a second grating tooth is generated in a similar manner, now accounting for the optical path length of the taper region and the first and second tooth. This routine is iterated until the desired number of grating teeth have been generated.

TABLE 2

| Wavelength | Angle from Trap Surface | Target Spot size |
| --- | --- | --- |
| 369 nm | 57.0° | >5 μm (non-focusing) |
| 399 nm | 43.9° | 3.3 μm |
| 435 nm | 43.9° | 3.3 μm |
| 760 nm | 21.4° | >20 μm (non-focusing) |
| 935 nm | 21.4° | >20 μm (non-focusing) |

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A photonic integrated circuit comprising:
a lower metal layer;
an intermetal dielectric level on the lower metal layer;
an upper metal layer on the intermetal dielectric level;
one or more optical waveguide levels within the intermetal dielectric level, each optical waveguide level including one or more optical waveguides formed therein, each of the one or more optical waveguide levels having corresponding top and bottom faces;
one or more optical gratings, each of the one or more optical gratings formed in a corresponding one of the one or more optical waveguide levels, each of the one or more optical gratings adapted to out-couple light; and one or more metal vias in the intermetal dielectric level, each of the one or more optical waveguides formed in each of the one or more optical waveguide levels laterally separated from each of the one or more metal vias by a distance D4, each of the one or more metal vias includes one or more encircling optical baffles, each of the one or more encircling optical baffles including a corresponding wall forming a "U" shape that at least partially encircles a corresponding one of the one or more optical gratings, each corresponding wall of each of the one or more encircling optical baffles being substantially perpendicular to a plane of the intermetal dielectric level, each of the one or more encircling optical baffles adapted to block stray light;

wherein:
a top face of an uppermost optical waveguide level of the one or more optical waveguide levels is a distance D1 from the upper metal layer;
a bottom face of a lowermost optical waveguide level of the one or more optical waveguide levels is a distance D2 from the lower metal layer; and
D1 and D2 are both at least 600 nm but not more than 1200 nm.

2. The photonic integrated circuit of claim 1, wherein the intermetal dielectric level includes silicon oxide.

3. The photonic integrated circuit of claim 1, wherein at least one of the one or more optical waveguide levels includes silicon nitride having a thickness of 250 nm±20%.

4. The photonic integrated circuit of claim 1, wherein at least one of the one or more optical waveguide levels includes alumina having a thickness of 150 nm±20%.

5. The photonic integrated circuit of claim 1, wherein D1 and D2 are both 800 nm±20%.

6. The photonic integrated circuit of claim 1, wherein the one or more optical waveguide levels is only one optical waveguide level.

7. The photonic integrated circuit of claim 1, wherein:
the one or more optical waveguide levels is two optical waveguide levels;
at least one of the two optical waveguide levels is a lower optical waveguide level;
at least another of the two optical waveguide levels is an upper optical waveguide level;
the lower optical waveguide level is closer to the lower metal layer than the upper metal layer;
the upper optical waveguide level is closer to the upper metal layer than the lower metal layer; and
the lower optical waveguide level is a distance D3 from the upper optical waveguide level.

8. The photonic integrated circuit of claim 7, wherein:
the lower optical waveguide level includes silicon nitride having a thickness of 250 nm±20%;
the upper optical waveguide level includes alumina having a thickness of 150 nm±20%;
D3 is 400 nm±50 nm; and
the intermetal dielectric level has a total thickness of 2.4 µm±20%.

9. The photonic integrated circuit of claim 1, wherein D4 is at least 600 nm.

10. The photonic integrated circuit of claim 1, further comprising one or more optical reflectors, each of the one or more optical reflectors formed in the lower metal layer below a corresponding one of the one or more optical gratings, each of the one or more optical reflectors adapted to reflect light.

11. The photonic integrated circuit of claim 1, further comprising:
a second intermetal dielectric level on the upper metal layer on a side opposite the intermetal dielectric layer;
a third metal layer on the second intermetal dielectric level on a side opposite the upper metal layer; and
one or more second level metal vias in the second intermetal dielectric level,
wherein the one or more second level metal vias includes one or more second level encircling optical baffles, each of the one or more second level encircling optical baffles at least partially encircling a corresponding one of the one or more optical gratings, each of the one or more second level encircling optical baffles adapted to block stray light.

12. The photonic integrated circuit of claim 1, wherein the one or more metal vias includes one or more linear optical baffles, each of the one or more linear optical baffles adjacent to a corresponding one of the one or more optical waveguides formed in each of the one or more optical waveguide levels, each of the one or more linear optical baffles adapted to block stray light.

13. The photonic integrated circuit of claim 12, wherein at least one of the one or more optical waveguides formed in each of the one or more optical waveguide levels is surrounded by the lower metal layer, the upper metal layer, and two of the one or more linear optical baffles.

14. The photonic integrated circuit of claim 1, further comprising one or more optical reflectors, each of the one or more optical reflectors formed in the lower metal layer below a corresponding one of the one or more optical gratings, each of the one or more optical reflectors adapted to reflect light.

15. The photonic integrated circuit of claim 1, further comprising:
a second intermetal dielectric level on the upper metal layer on a side opposite the intermetal dielectric layer;
a third metal layer on the second intermetal dielectric level on a side opposite the upper metal layer; and
one or more second optical waveguide levels within the second intermetal dielectric level, each second optical waveguide level including one or more second level optical waveguides formed therein, each of the one or more second optical waveguide levels having corresponding top and bottom faces;
wherein:
a top face of an uppermost second optical waveguide level of the one or more second optical waveguide levels is a distance D5 from the third metal layer;
a bottom face of a lowermost second optical waveguide level of the one or more second optical waveguide levels is a distance D6 from the upper metal layer; and
D5 and D6 are both at least 600 nm but not more than 1200 nm.

16. An optical detector comprising:
a substrate doped with a first dopant type, the substrate adapted to be a cathode;
one or more anodes formed in a surface of the substrate, the one or more anodes doped with a second dopant type;

one or more deep guard ring implants formed in the surface of the substrate, the one or more deep guard ring implants doped with the second dopant type, each of the one or more deep guard ring implants formed around a corresponding one of the one or more anodes;

a substrate contact formed in the surface of the substrate around the one or more anodes, the substrate contact doped with the first dopant type;

a first oxide layer formed on the surface of the substrate, a first aperture formed in the first oxide layer exposing at least the one or more anodes;

one or more first vias formed through the first oxide layer, each of the one or more first vias in electrical contact with a corresponding one of the one or more anodes;

a second via formed through the first oxide layer, the second via in electrical contact with the substrate contact;

a first metal layer formed on the first oxide layer, the one or more first vias and the second via in electrical contact with the first metal layer, a second aperture formed in the first metal layer directly over the first aperture;

a second oxide layer formed on the first metal layer, a third aperture formed in the second oxide layer directly over the second; and a second metal layer formed on the second oxide layer, the second metal layer including a mesh suspended over the third aperture, the mesh adapted to allow light to fall on the one or more anodes, the mesh further adapted to provide electric field shielding.

17. The optical detector of claim 16, wherein the mesh includes one of a hub and spoke configuration or a rectilinear mesh configuration.

\* \* \* \* \*